(12) United States Patent
Yu et al.

(10) Patent No.: US 12,315,854 B2
(45) Date of Patent: *May 27, 2025

(54) INTEGRATED CIRCUIT PACKAGE AND METHOD

(71) Applicant: Taiwan Semiconductor Manufacturing Co., Ltd., Hsinchu (TW)

(72) Inventors: Chen-Hua Yu, Hsinchu (TW); Wei Ling Chang, Hsinchu (TW); Chuei-Tang Wang, Taichung (TW); Chieh-Yen Chen, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/593,536

(22) Filed: Mar. 1, 2024

(65) Prior Publication Data
US 2024/0258286 A1    Aug. 1, 2024

Related U.S. Application Data

(63) Continuation of application No. 17/854,386, filed on Jun. 30, 2022, now Pat. No. 11,948,926, which is a
(Continued)

(51) Int. Cl.
*H01L 25/16* (2023.01)
*H01L 23/00* (2006.01)

(52) U.S. Cl.
CPC .............. *H01L 25/16* (2013.01); *H01L 24/19* (2013.01); *H01L 24/20* (2013.01); *H01L 24/27* (2013.01);
(Continued)

(58) Field of Classification Search
CPC ......... H01L 25/16; H01L 24/19; H01L 24/20; H01L 24/27; H01L 24/29; H01L 2924/12; H01L 2924/1431; H01L 2924/1434
See application file for complete search history.

(56) References Cited

U.S. PATENT DOCUMENTS

| 8,361,842 B2 | 1/2013 | Yu et al. |
| 8,680,647 B2 | 3/2014 | Yu et al. |

(Continued)

FOREIGN PATENT DOCUMENTS

| CN | 107039249 A | 8/2017 |
| CN | 109309074 A | 2/2019 |

(Continued)

*Primary Examiner* — Fernando L Toledo
*Assistant Examiner* — Neil R Prasad
(74) *Attorney, Agent, or Firm* — Slater Matsil, LLP

(57) ABSTRACT

In an embodiment, a structure includes: a processor device including logic devices; a first memory device directly face-to-face bonded to the processor device by metal-to-metal bonds and by dielectric-to-dielectric bonds; a first dielectric layer laterally surrounding the first memory device; a redistribution structure over the first dielectric layer and the first memory device, the redistribution structure including metallization patterns; and first conductive vias extending through the first dielectric layer, the first conductive vias connecting the metallization patterns of the redistribution structure to the processor device.

20 Claims, 33 Drawing Sheets

Related U.S. Application Data continuation of application No. 16/882,054, filed on May 22, 2020, now Pat. No. 11,387,222.

(60) Provisional application No. 62/923,161, filed on Oct. 18, 2019.

(52) U.S. Cl.
CPC .......... *H01L 24/29* (2013.01); *H01L 2924/12* (2013.01); *H01L 2924/1431* (2013.01); *H01L 2924/1434* (2013.01)

(56) References Cited

U.S. PATENT DOCUMENTS

| | | | |
|---|---|---|---|
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 10,290,611 B2 | 5/2019 | Yu et al. | |
| 10,522,449 B2 | 12/2019 | Chen et al. | |
| 10,529,650 B2 | 1/2020 | Chen et al. | |
| 10,892,011 B2 | 1/2021 | Lin et al. | |
| 11,031,342 B2 | 6/2021 | Tseng et al. | |
| 11,037,904 B2 | 6/2021 | Yu et al. | |
| 11,387,222 B2 * | 7/2022 | Yu | H01L 25/16 |
| 11,948,926 B2 * | 4/2024 | Yu | H01L 25/50 |
| 2011/0175215 A1 | 7/2011 | Farooq et al. | |
| 2011/0291288 A1 | 12/2011 | Wu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2016/0133603 A1 | 5/2016 | Ahn et al. | |
| 2019/0019756 A1 | 1/2019 | Yu et al. | |
| 2019/0115277 A1 | 4/2019 | Yu et al. | |
| 2019/0148336 A1 | 5/2019 | Chen et al. | |
| 2019/0244943 A1 | 8/2019 | Fan | |
| 2019/0287956 A1 | 9/2019 | Raorane et al. | |
| 2019/0295912 A1 | 9/2019 | Yu et al. | |
| 2019/0333910 A1 | 10/2019 | Shin et al. | |
| 2019/0385977 A1 | 12/2019 | Elsherbini et al. | |
| 2020/0381395 A1 | 12/2020 | Han et al. | |

FOREIGN PATENT DOCUMENTS

| | | |
|---|---|---|
| CN | 109786350 A | 5/2019 |
| CN | 109786360 A | 5/2019 |
| KR | 20180114491 A | 10/2018 |
| KR | 20190055694 A | 5/2019 |
| TW | 201911476 A | 3/2019 |
| TW | 201935633 A | 9/2019 |

* cited by examiner

INTEGRATED CIRCUIT PACKAGE AND METHOD

PRIORITY CLAIM AND CROSS-REFERENCE

This application is a continuation of U.S. patent Ser. No. 17/854,386, filed on Jun. 30, 2022, entitled "Integrated Circuit Package and Method," which is a continuation of U.S. patent Ser. No. 16/882,054, filed on May 22, 2020, entitled "Integrated Circuit Package and Method," now U.S. Pat. No. 11,387,222, issued on Jul. 12, 2022, which claims the benefit of U.S. Provisional Application No. 62/923,161, filed on Oct. 18, 2019, which applications are hereby incorporated herein by reference.

BACKGROUND

As semiconductor technologies continue to evolve, integrated circuit dies are becoming increasingly smaller. Further, more functions are being integrated into the dies. Accordingly, the numbers of input/output (I/O) pads needed by dies has increased while the area available for the I/O pads has decreased. The density of the I/O pads has risen quickly over time, increasing the difficulty of die packaging. Some applications call for greater parallel processing capabilities of integrated circuit dies. Packaging technologies may be used to integrate of multiple dies, allowing a greater degree of parallel processing capabilities.

In some packaging technologies, integrated circuit dies are singulated from wafers before they are packaged. An advantageous feature of this packaging technology is the possibility of forming fan-out packages, which allow the I/O pads on a die to be redistributed to a greater area. The number of I/O pads on the surfaces of the dies may thus be increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
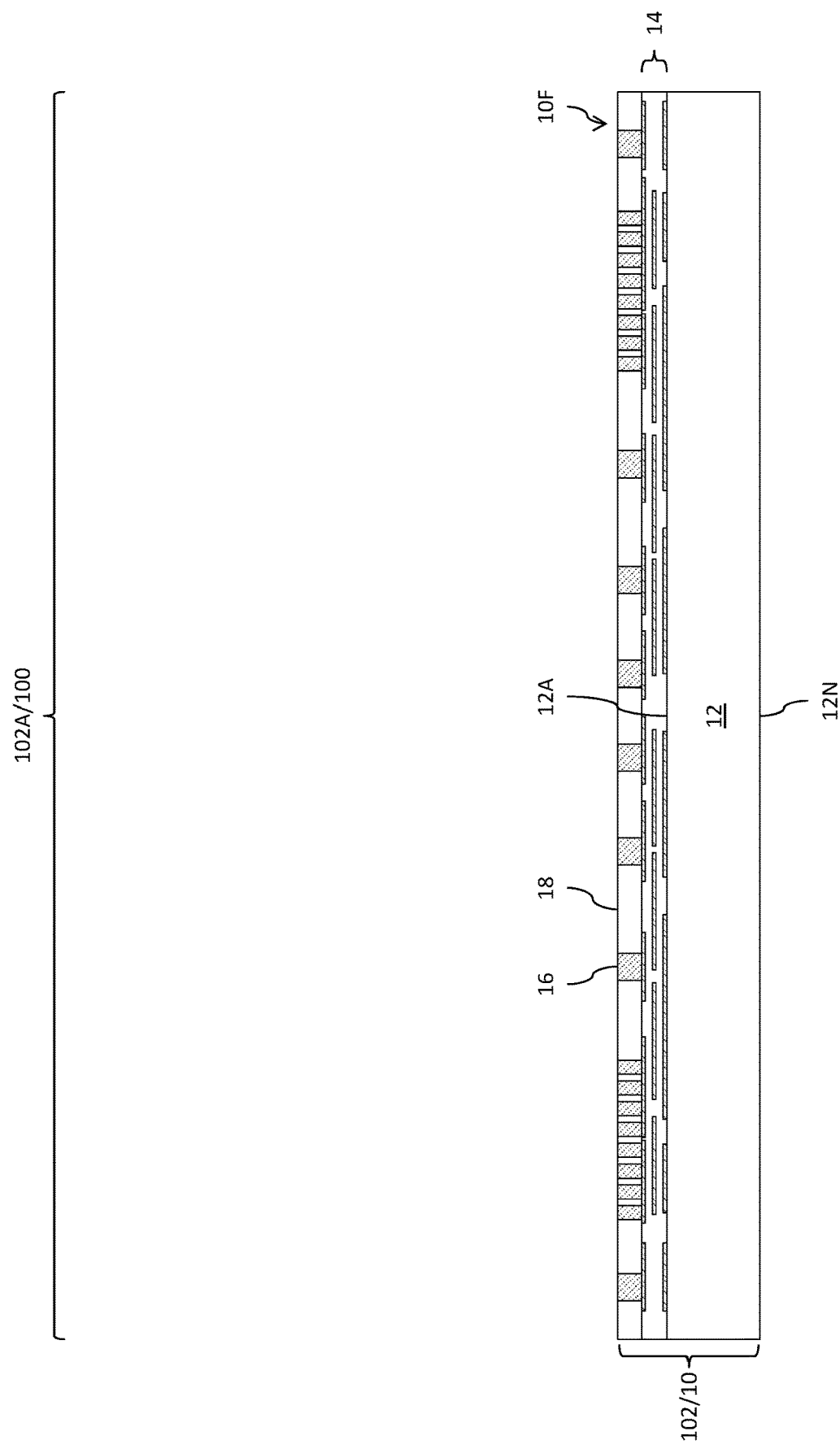
FIGS. 1 through 10 are various views of intermediate steps during a process for forming an integrated circuit package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a processor device is formed without memories, and an integrated circuit package is formed by stacking memory devices on the processor device. Forming a processor device without memories allows more processing units (e.g., cores) to be included in the processor device without substantially increasing the footprint of the processor device. The processor device and memory devices are connected (e.g., physically and electrically coupled) by hybrid bonding. Connecting the processor device and memory devices by hybrid bonding allows the connections between the devices to be shorter than traditional interconnects, allowing for improvements in the performance and power consumption of the integrated circuit package.

Figure 8:
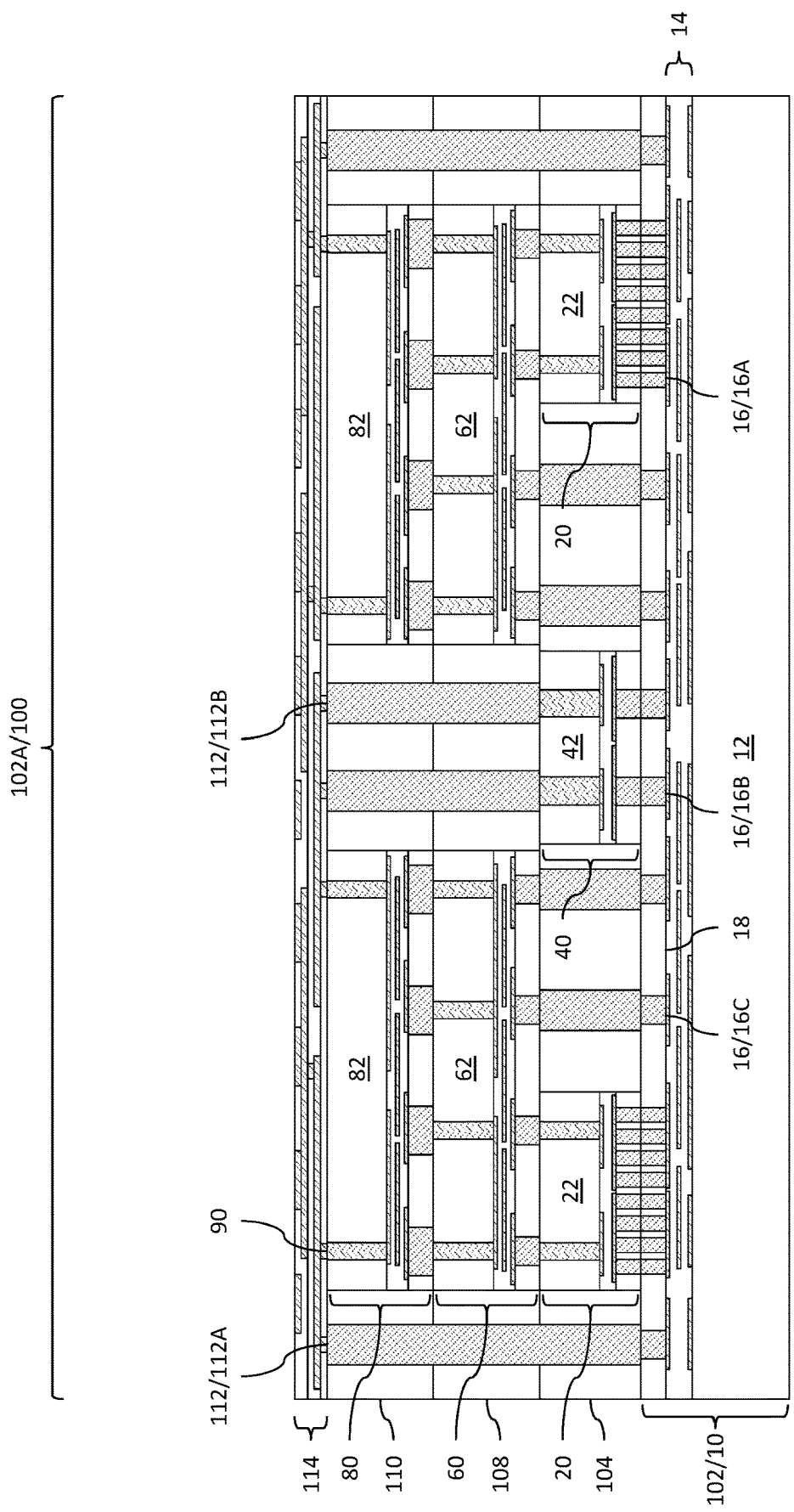
Figure 9:
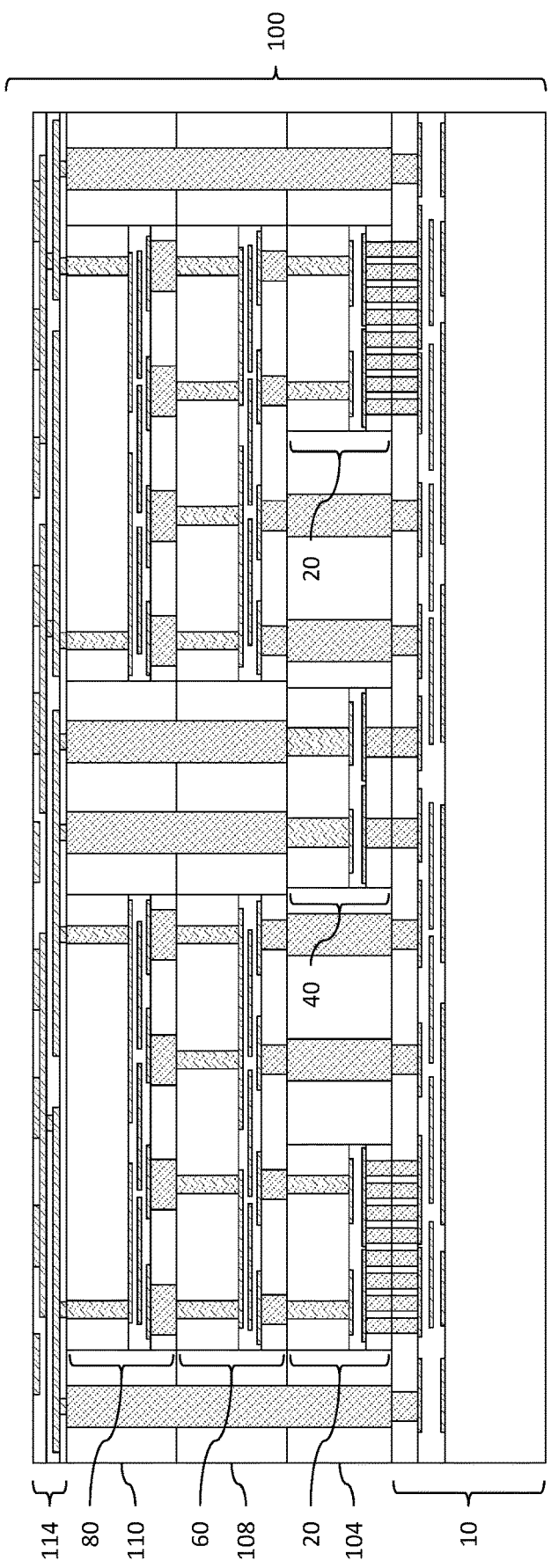
Figure 10:
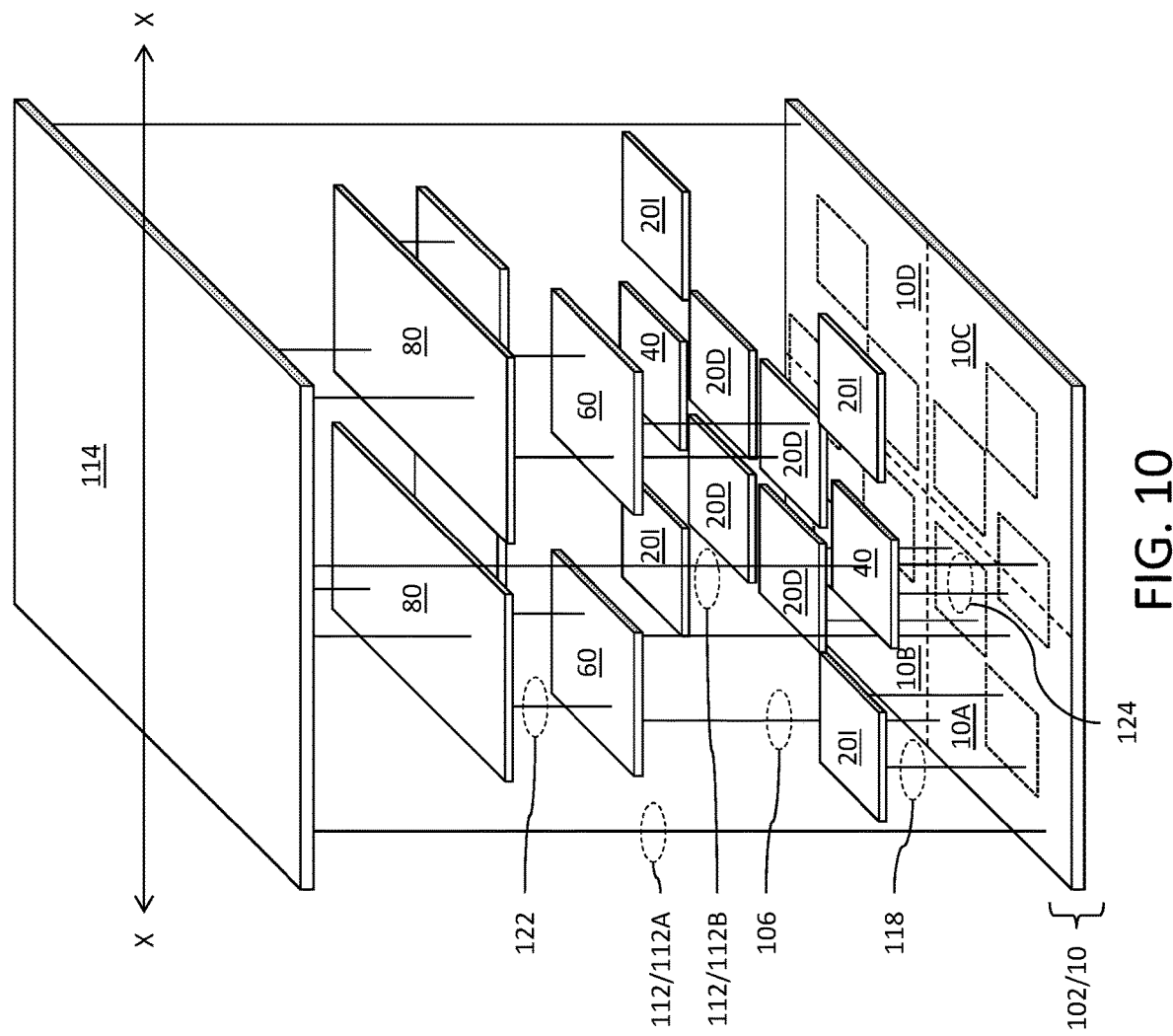

FIGS. 1 through 10 are various views of intermediate steps during a process for forming an integrated circuit package 100, in accordance with some embodiments. FIGS. 1 through 9 are cross-sectional views of the integrated circuit package 100, and FIG. 10 is a three-dimensional diagram illustrating electrical connections among the semiconductor devices of the integrated circuit package 100, where the cross-sectional views are illustrated along reference cross-section X-X in FIG. 10. Some features are omitted from FIG. 10 for clarity of illustration.

The integrated circuit package 100 is formed by stacking semiconductor devices on a wafer 102. Stacking of devices in one device region 102A of the wafer 102 is illustrated, but it should be appreciated that the wafer 102 may have any number of device regions, and semiconductor devices may be stacked to form an integrated circuit package in each device region. The semiconductor devices can be bare integrated circuit dies or packaged dies. In the embodiment illustrated, each semiconductor device is a bare integrated circuit die. In other embodiments, one or more of the illustrated semiconductor devices can be packaged dies that are encapsulated.

In FIG. 1, the wafer 102 is obtained. The wafer 102 comprises a processor device 10 in the device region 102A. The processor device 10 will be singulated in subsequent processing to be included in the integrated circuit package 100. The processor device 10 can be any acceptable processor or logic device, such as a central processing unit (CPU), graphics processing unit (GPU), system-on-a-chip (SoC), application processor (AP), digital signal processing (DSP), field programmable gate array (FPGA), microcontroller, artificial intelligence (AI) accelerator, or the like.

The processor device 10 may be processed according to applicable manufacturing processes to form integrated circuits. For example, the processor device 10 includes a semiconductor substrate 12, such as silicon, doped or undoped, or an active layer of a semiconductor-on-insulator (SOI) substrate. The semiconductor substrate 12 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 12 has an active surface 12A and an inactive surface 12N.

Devices may be formed at the active surface 12A of the semiconductor substrate 12. The devices may be active devices (e.g., transistors, diodes, etc.), capacitors, resistors, etc. The inactive surface 12N may be free from devices. An inter-layer dielectric (ILD) is over the active surface 12A of the semiconductor substrate 12. The ILD surrounds and may cover the devices. The ILD may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

An interconnect structure 14 is over the active surface 12A of the semiconductor substrate 12. The interconnect structure 14 interconnects the devices at the active surface 12A of the semiconductor substrate 12 to form an integrated circuit. The interconnect structure 14 may be formed by, for example, metallization patterns in dielectric layers. The metallization patterns include metal lines and vias formed in one or more dielectric layers. The metallization patterns of the interconnect structure 14 are electrically coupled to the devices at the active surface 12A of the semiconductor substrate 12.

Die connectors 16 are at a front side 10F of the processor device 10. The die connectors 16 may be conductive pillars, pads, or the like, to which external connections are made. The die connectors 16 are in and/or on the interconnect structure 14. The die connectors 16 can be formed of a metal, such as copper, aluminum, or the like, and can be formed by, for example, plating, or the like.

A dielectric layer 18 is at the front side 10F the processor device 10. The dielectric layer 18 is in and/or on the interconnect structure 14. The dielectric layer 18 laterally encapsulates the die connectors 16, and the dielectric layer 18 will be laterally coterminous with sidewalls of the processor device 10 after singulation (discussed further below). Initially, the dielectric layer 18 may bury the die connectors 16, such that the topmost surface of the dielectric layer 18 is above the topmost surfaces of the die connectors 16. The dielectric layer 18 may be an oxide such as silicon oxide, PSG, BSG, BPSG, or the like; a nitride such as silicon nitride or the like; a polymer such as PBO, polyimide, BCB, or the like; the like; or a combination thereof. The dielectric layer 18 may be formed, for example, by spin coating, lamination, chemical vapor deposition (CVD), or the like. After formation, the die connectors 16 and dielectric layer 18 can be planarized using, e.g., a chemical-mechanical polish (CMP) process, an etch back process, the like, or combinations thereof. After planarization, surfaces of the die connectors 16 and dielectric layer 18 are planar and are exposed at the front side 10F of the processor device 10.

In some embodiments, the processor device 10 is a CPU that includes multiple processing units (e.g., cores). For example, referring to FIG. 10, the processor device 10 can be a quad-core processor that comprises a first processing unit 10A in a first region of the semiconductor device, a second processing unit 10B in a second region of the semiconductor device, a third processing unit 10C in a third region of the semiconductor device, and a fourth processing unit 10D in a fourth region of the semiconductor device. The processing units of the processor device 10 are formed without (e.g., are free from) memories, and only include logic devices. In other words, the processor device 10 does not include memory devices such as DRAM, SRAM, etc. devices. As discussed further below, separate memory devices will be stacked on the processor device 10 to provide memories for the processing units.

Figure 2:
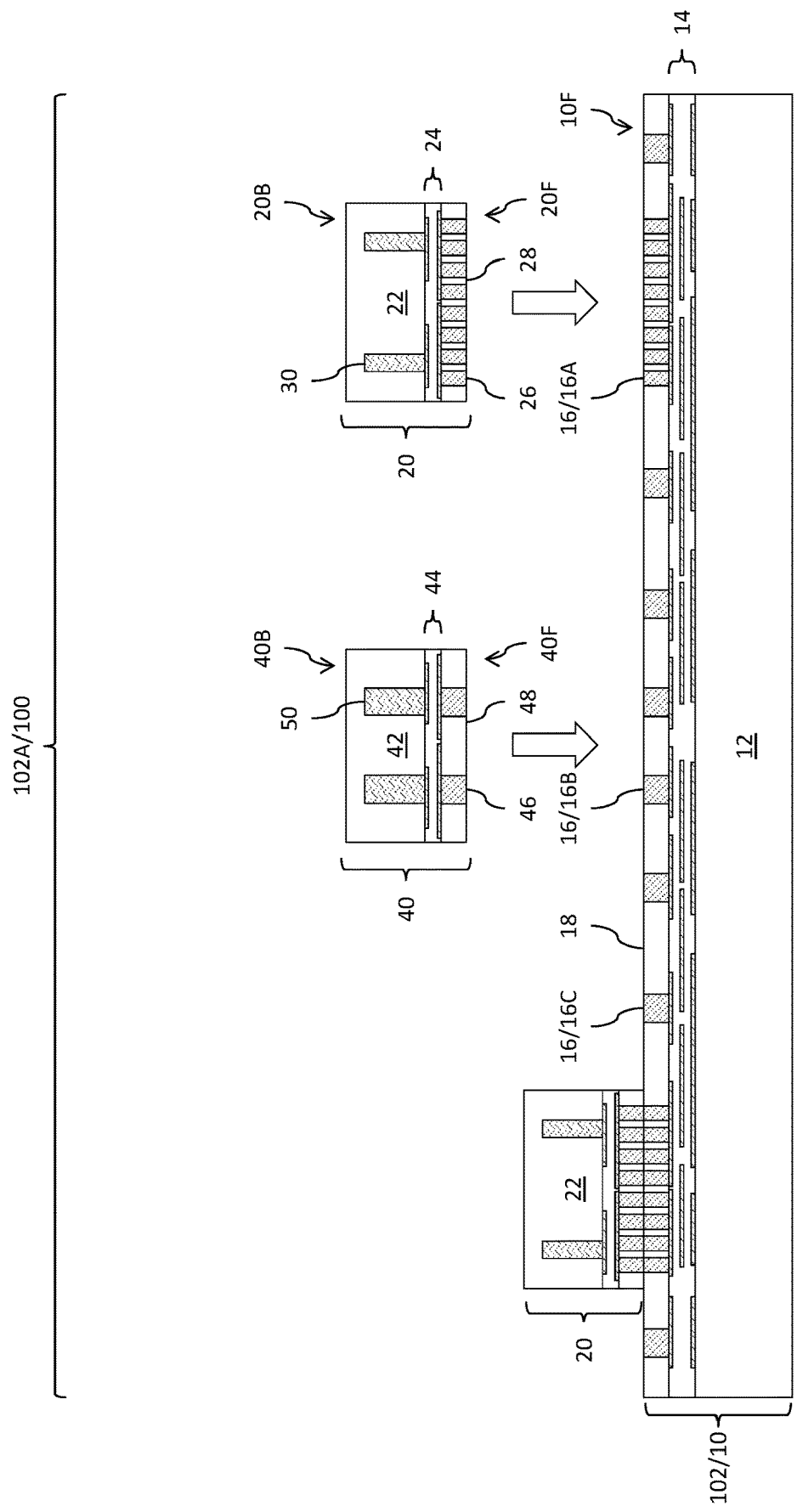

In FIG. 2, first memory devices 20 are bonded to the processor device 10 (e.g., the wafer 102). The first memory devices 20 can be any acceptable memory devices, such as dynamic random access memory (DRAM) devices, static random access memory (SRAM) devices, resistive random-access memory (RRAM) devices, magnetoresistive random-access memory (MRAM) devices, phase-change random-access memory (PCRAM) devices, or the like.

Each first memory device 20 may be processed according to applicable manufacturing processes to form integrated circuits. For example, the first memory device 20 includes a semiconductor substrate 22, an interconnect structure 24, die connectors 26, and a dielectric layer 28 which, respectively, can be similar to the semiconductor substrate 12, interconnect structure 14, die connectors 16, and dielectric layer 18. The die connectors 26 and dielectric layer 28 are exposed at a front side 20F of the first memory device 20. The first memory device 20 further includes conductive vias 30, which are formed extending into the semiconductor substrate 22. The conductive vias 30 are electrically coupled to metallization patterns of the interconnect structure 24.

As an example to form the conductive vias 30, recesses can be formed in the interconnect structure 24 and/or semiconductor substrate 22 by, for example, etching, milling, laser techniques, a combination thereof, and/or the like. A thin dielectric material may be formed in the recesses, such as by using an oxidation technique. A thin barrier layer may be conformally deposited in the openings, such as by CVD, atomic layer deposition (ALD), physical vapor deposition (PVD), thermal oxidation, a combination thereof, and/or the like. The barrier layer may be formed from an oxide, a nitride, or an oxynitride, such as titanium nitride, titanium oxynitride, tantalum nitride, tantalum oxynitride, tungsten nitride, a combination thereof, and/or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from the surface of the interconnect structure 24 and/or semiconductor substrate 22 by, for example, a CMP. Remaining portions of the barrier layer and conductive material form the conductive vias 30.

In the embodiment illustrated, the conductive vias 30 are not yet exposed at a back side 20B of the first memory device 20. Rather, the conductive vias 30 are buried in the semiconductor substrate 22. As discussed further below, the conductive vias 30 will be exposed at the back side 20B of the first memory device 20 through a planarization process in subsequent processing. After exposure, the conductive vias 30 can be referred to as through-substrate vias or through-silicon vias (TSVs).

In some embodiments, the first memory devices 20 are memories for the processor device 10. For example, the first memory devices 20 can be level 1 (L1) caches for the processor device 10. Bonding the first memory devices 20 to the processor device 10 instead of including memories with the processor device 10 may allow the overall amount of memory in the integrated circuit package 100 to be increased without substantially increasing manufacturing costs of the processor devices. Further, forming the processor device 10 without memories allows more processing units (e.g., cores) to be included in the processor devices without substantially increasing the footprint of the processor devices. Processors with many processing units can be particularly for some applications, such as artificial intelligence (AI) and high-performance computing (HPC) applications.

Referring to FIG. 10, two of the first memory devices 20 can be placed on each processing unit of the processor device 10. For example, when the integrated circuit package 100 follows the von Neumann architecture, an instruction cache device 20I (e.g., a L1i cache) and a data cache device 20D (e.g., a L1d cache) are stacked directly over each region of the processor device 10 corresponding to the processing units 10A, 10B, 10C, 10D. The instruction cache devices 20I are used to speed up executable instruction fetches for the processor device 10, and the data cache devices 20D are used to speed up data fetch and store operations for the processor device 10. Placing the first memory devices 20 directly over their corresponding processing units 10A, 10B, 10C, 10D allows the length of interconnections between logic devices and their corresponding memories to be reduced. The first memory devices 20 are connected to the processor device 10 by direct bonds, over which control signaling and data signaling are performed. The latency of data signaling and the interconnection bandwidth between the processor device 10 and their corresponding first memory devices 20 may thus be improved. Further, the impedance and thus power consumption of the interconnections may also be reduced.

The processor device 10 and first memory devices 20 are directly bonded in a face-to-face manner by hybrid bonding, such that the front side 10F of the processor device 10 is bonded to the front sides 20F of the first memory devices 20. Specifically, the dielectric layer 18 of the processor device 10 is bonded to the dielectric layers 28 of the first memory devices 20 through dielectric-to-dielectric bonding, without using any adhesive material (e.g., die attach film), and a subset of the die connectors 16A of the processor device 10 are bonded to the die connectors 26 of the first memory devices 20 through metal-to-metal bonding, without using any eutectic material (e.g., solder). The bonding may include a pre-bonding and an annealing. During the pre-bonding, a small pressing force is applied to press the first memory devices 20 against the processor device 10 (e.g., the wafer 102). The pre-bonding is performed at a low temperature, such as room temperature, such as a temperature in the range of about 15° C. to about 30° C., and after the pre-bonding, the dielectric layers 18 and 28 are bonded to each other. The bonding strength is then improved in a subsequent annealing step, in which the dielectric layers 18 and 28 are annealed at a high temperature, such as a temperature in the range of about 100° C. to about 450° C. After the annealing, bonds, such as fusions bonds, are formed bonding the dielectric layers 18 and 28. For example, the bonds can be covalent bonds between the material of the dielectric layer 18 and the material of the dielectric layer 28. The die connectors 16A and 26 are connected to each other with a one-to-one correspondence. The die connectors 16A and 26 may be in physical contact after the pre-bonding, or may expand to be brought into physical contact during the annealing. Further, during the annealing, the material of the die connectors 16A and 26 (e.g., copper) intermingles, so that metal-to-metal bonds are also formed. Hence, the resulting bonds between the processor device 10 and first memory devices 20 are hybrid bonds that include both dielectric-to-dielectric bonds and metal-to-metal bonds.

The first memory devices 20 have active devices of a minimum feature size in the range of about 2 nm to about 65 nm. As such, the die connectors 26 of the first memory devices 20 can have a small pitch. For example, the die connectors 26 can have a pitch in the range of about 0.05 μm to about 10 μm. The die connectors 16A have the same pitch as the die connectors 26. Forming the die connectors 16A and 26 at a small pitch allows for a large quantity of connections between the processor device 10 and the first memory devices 20, which can be particularly advantageous when the first memory devices 20 are L1 caches.

Optionally, passive devices 40 are also bonded to the processor device 10 (e.g., the wafer 102). The passive devices 40 can be any acceptable passive devices, such as integrated passive devices (IPDs), power management integrated circuits (PMICs), integrated voltage regulators (IVRs), or the like.

Each passive device 40 may be processed according to applicable manufacturing processes to form integrated circuits. For example, the passive device 40 includes a semiconductor substrate 42, which can be similar to the semiconductor substrate 12, but includes passive devices (e.g., resistors, capacitors, inductors, etc.) and is free of active devices (e.g., transistors, diodes, etc.). The passive device 40 also includes an interconnect structure 44, die connectors 46, a dielectric layer 48, and conductive vias 50 which, respectively, can be similar to the interconnect structure 14, die connectors 16, dielectric layer 18, and conductive vias 30. The die connectors 46 and dielectric layer 48 are exposed at a front side 40F of the passive device 40. In the embodiment illustrated, the conductive vias 50 are not yet exposed at a back side 40B of the passive device 40, but will be exposed in subsequent processing.

Referring to FIG. 10, the passive devices 40 are placed over one or more processing units of the processor device 10. The passive devices 40 can be shared by some or all of the processing units 10A, 10B, 10C, 10D. In embodiments where the passive devices 40 are PMICs, they can be part of the power delivery network for the processor device 10.

The processor device 10 and passive devices 40 are directly bonded in a face-to-face manner by hybrid bonding, such that the front side 10F of the processor device 10 is bonded to the front sides 40F of the passive devices 40. Specifically, the dielectric layer 18 of the processor device 10 is bonded to the dielectric layers 28 of the passive devices 40 through dielectric-to-dielectric bonding, without using any adhesive material (e.g., die attach film), and a subset of the die connectors 16B of the processor device 10 are bonded to the die connectors 46 of the passive devices 40 through metal-to-metal bonding, without using any eutectic material (e.g., solder). The hybrid bonding may be similar to the bonding of the processor device 10 and first memory devices 20, described above. In some embodiments, the passive devices 40 and first memory devices 20 are simultaneously bonded to the processor device 10.

The die connectors 46 of the passive devices 40 can have a large pitch. For example, the die connectors 46 can have a pitch in the range of about 9 μm to about 90 μm. The die connectors 16B have the same pitch as the die connectors 46. Forming the die connectors 16B and 46 at a large pitch allows the connections between the processor device 10 and the first memory devices 20 to be formed at a low cost, which can be particularly advantageous when the passive devices 40 are devices with a low complexity such as PMICs.

Figure 3:
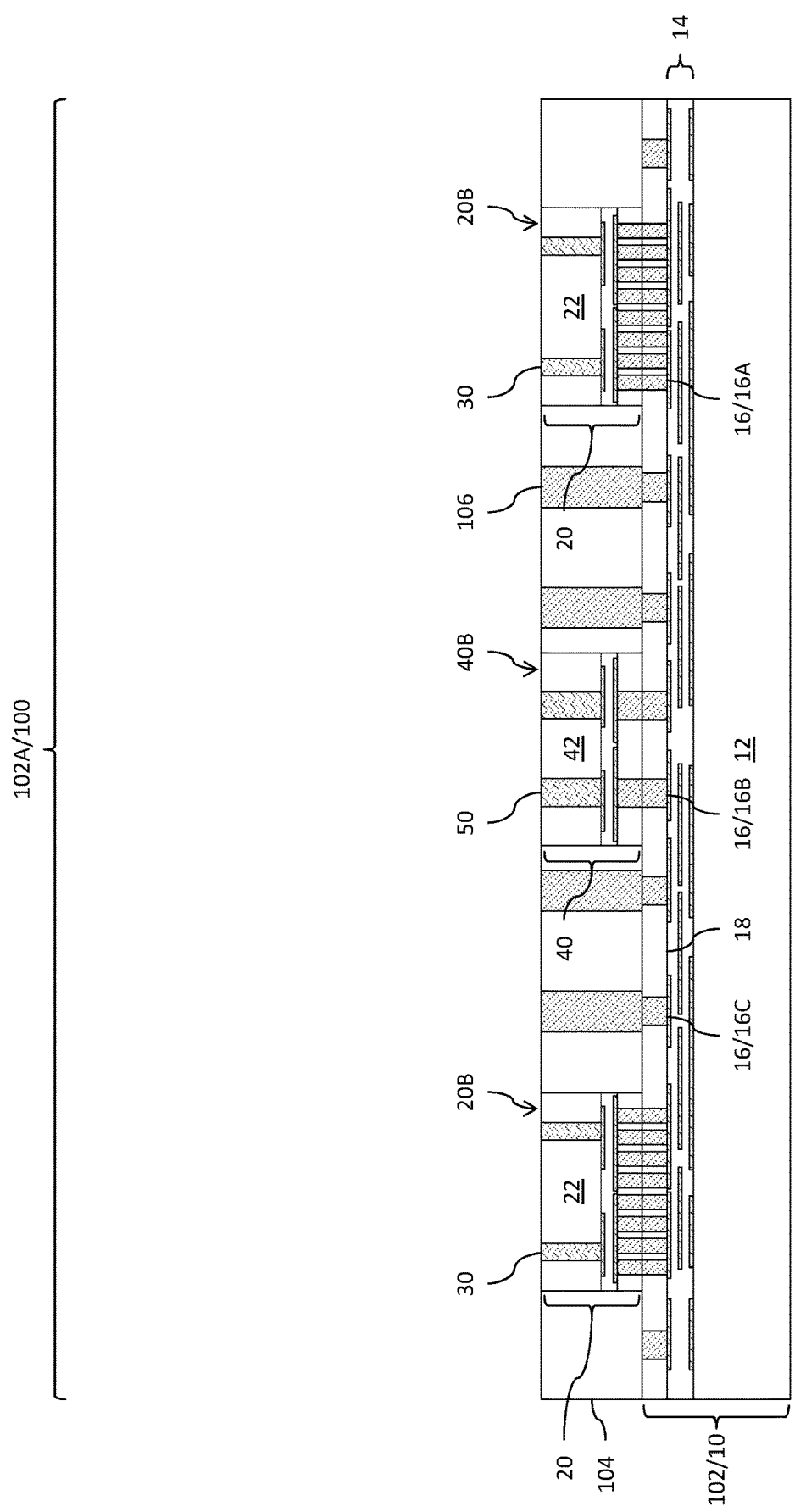

In FIG. 3, a dielectric layer 104 is formed surrounding the first memory devices 20 and passive devices 40. The dielectric layer 104 can be formed after placement of the first memory devices 20 and passive devices 40 but before annealing to complete the hybrid bonding, or can be formed after annealing. The dielectric layer 104 fills gaps between the first memory devices 20 and passive devices 40, thus protecting the semiconductor devices. The dielectric layer 104 may be an oxide such as silicon oxide, PSG, BSG, BPSG, or the like; a nitride such as silicon nitride or the like; a polymer such as polybenzoxazole (PBO), polyimide, benzocyclobuten (BCB), or the like; an encapsulant such as a molding compound, epoxy, or the like; the like, or a combination thereof. In some embodiments, the dielectric layer 104 is an oxide such as silicon oxide.

Conductive vias 106 are then formed to extend through the dielectric layer 104. As an example to form the conductive vias 106, openings are patterned in the dielectric layer 104. The patterning may be by an acceptable process, such as by exposing the dielectric layer 104 to light when the dielectric layer 104 is a photo-sensitive material, or by etching the dielectric layer 104 using, for example, an anisotropic etch. The openings expose a subset of the die connectors 16C of the processor device 10. A seed layer is formed on the dielectric layer 104 and on portions of the die connectors 16C exposed by the openings. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A conductive material is formed on the seed layer. The conductive material may be formed by plating, such as electroplating or electroless plating, or the like. The conductive material may comprise a metal, such as copper, titanium, tungsten, aluminum, or the like. Excess portions of the seed layer and conductive material are then removed, with the excess portions being portions overlying the dielectric layer 104. The removal may be by a planarization process. The planarization process is performed on the seed layer, conductive material, dielectric layer 104, first memory devices 20, and passive devices 40. The removal simultaneously removes excess portions of the seed layer and conductive material and exposes the conductive vias 30 and 50. The planarization process may be, for example, a CMP process, a grinding process, an etch back process, the like, or combinations thereof. The remaining portions of the seed layer and conductive material in the openings form the conductive vias 106. Top surfaces of the dielectric layer 104, conductive vias 106, semiconductor substrates 22 and 42, and conductive vias 30 and 50 are planar after the planarization process.

Figure 4:
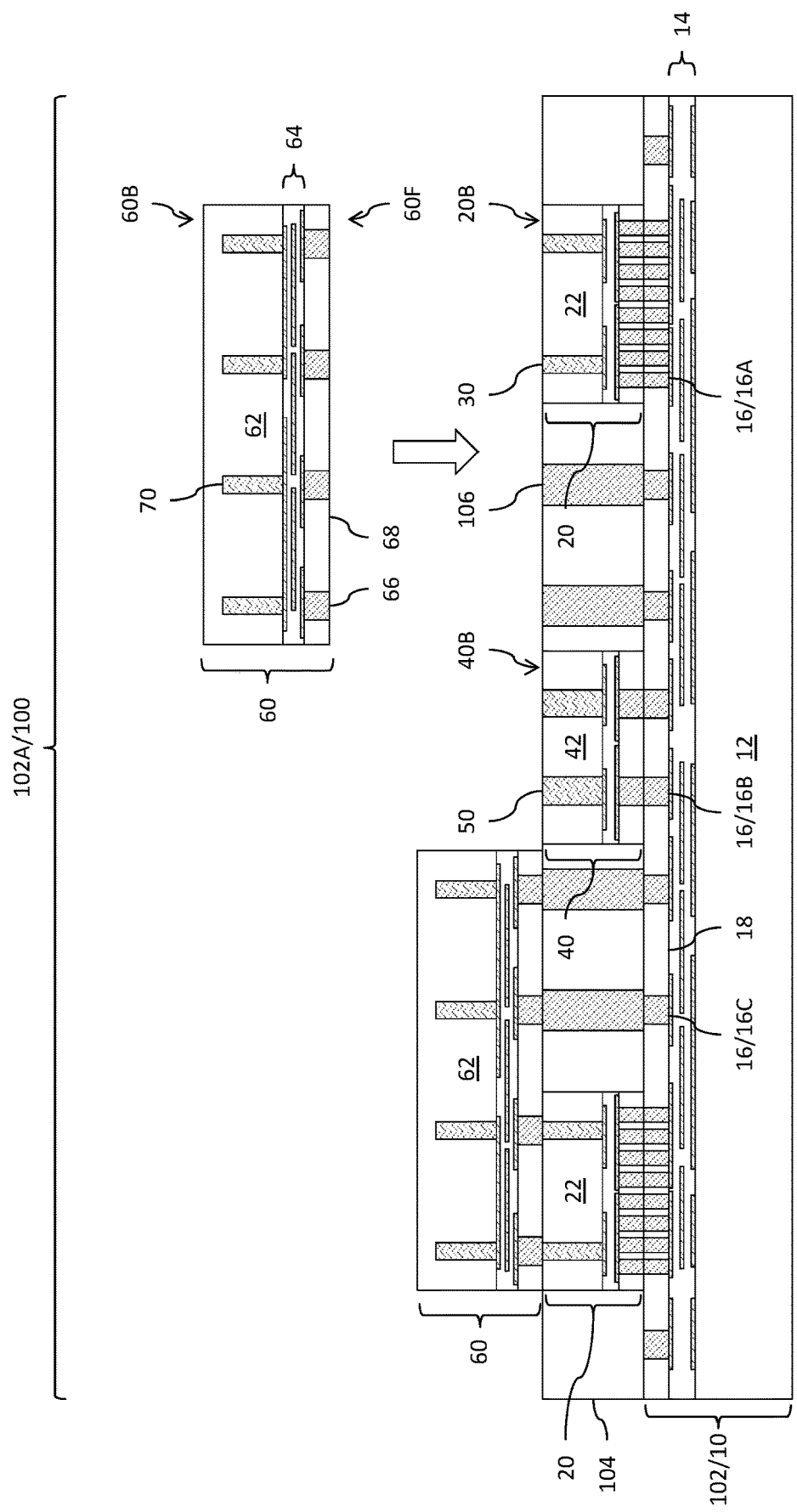

In FIG. 4, second memory devices 60 are bonded to the first memory devices 20 and the conductive vias 106. The second memory devices 60 can be any acceptable memory devices, such as dynamic random access memory (DRAM) devices, static random access memory (SRAM) devices, resistive random-access memory (RRAM) devices, magnetoresistive random-access memory (MRAM) devices, phase-change random-access memory (PCRAM) devices, or the like.

Each second memory device 60 may be processed according to applicable manufacturing processes to form integrated circuits. For example, the second memory device 60 includes a semiconductor substrate 62, an interconnect structure 64, die connectors 66, a dielectric layer 68, and conductive vias 70 which, respectively, can be similar to the semiconductor substrate 12, interconnect structure 14, die connectors 16, dielectric layer 18, and conductive vias 30. The die connectors 66 and dielectric layer 68 are exposed at a front side 60F of the second memory device 60. In the embodiment illustrated, the conductive vias 70 are not yet exposed at a back side 60B of the second memory device 60, but will be exposed in subsequent processing to form TSVs.

In some embodiments, the second memory devices 60 are memories for the processor device 10. For example, the second memory devices 60 can be level 2 (L2) caches for the processor device 10.

Referring to FIG. 10, one of the second memory devices 60 is placed over each processing unit of the processor device 10. Placing the second memory devices 60 directly over their corresponding processing units 10A, 10B, 10C, 10D allows the length of interconnections between logic devices and their corresponding memories to be reduced. The second memory devices 60 are electrically coupled to the processor device 10 by the conductive vias 106, over which control signaling may be performed. Further, each of the second memory devices 60 are placed over the instruction cache device 20I and data cache device 20D for their corresponding processing units 10A, 10B, 10C, 10D. The second memory devices 60 are connected to the first memory devices 20 by direct bonds, over which data signaling is performed. The direct bonds are shorter than the conductive vias 106, and so the latency and power consumption of the interconnections between the memory devices may be improved.

The second memory devices 60 and first memory devices 20 are directly bonded in a face-to-back manner by hybrid bonding, such that the back sides 20B of the first memory devices 20 are bonded to the front sides 60F of the second memory devices 60. Specifically, the semiconductor substrates 22 of the first memory devices 20 are bonded to the dielectric layers 68 of the second memory devices 60 through dielectric-to-dielectric bonding, without using any adhesive material (e.g., die attach film), and the conductive vias 30 of the first memory devices 20 are bonded to the die connectors 66 of the second memory devices 60 through metal-to-metal bonding, without using any eutectic material (e.g., solder). In some embodiments, an oxide, such as a native oxide, a thermal oxide, or the like, is formed at the back sides 20B of the first memory devices 20, such as on the semiconductor substrates 22, and is used for the dielectric-to-dielectric bonding. The hybrid bonding may be similar to the bonding of the processor device 10 and first memory devices 20, described above.

The second memory devices 60 are wider than the first memory devices 20, and so some portions of the conductive vias 106 and dielectric layer 104 also participating in the hybrid bonding. Specifically, the dielectric layers 68 of the second memory devices 60 are bonded to portions of the dielectric layer 104 through dielectric-to-dielectric bonding, without using any adhesive material (e.g., die attach film). Likewise, the die connectors 66 of the second memory devices 60 are bonded to the conductive vias 106 through metal-to-metal bonding, without using any eutectic material (e.g., solder).

The second memory devices 60 have active devices of a minimum feature size in the range of about 2 nm to about 65 nm. In some embodiments, the minimum feature size of the active devices of the second memory devices 60 is larger than the minimum feature size of the active devices of the first memory devices 20. As such, the die connectors 66 of the second memory devices 60 can have a larger pitch than the die connectors 26 of the first memory devices 20. For example, the die connectors 66 can have a pitch in the range of about 0.3 μm to about 90 μm. The conductive vias 30 and 106 have the same pitch as the die connectors 66. Forming the die connectors 66 and the conductive vias 30 and 106 at a large pitch allows the connections between the first memory devices 20 and the second memory devices 60 to be formed at a low cost, which can be particularly advantageous when the second memory devices 60 are devices with a low complexity such as L2 cache.

Figure 5:
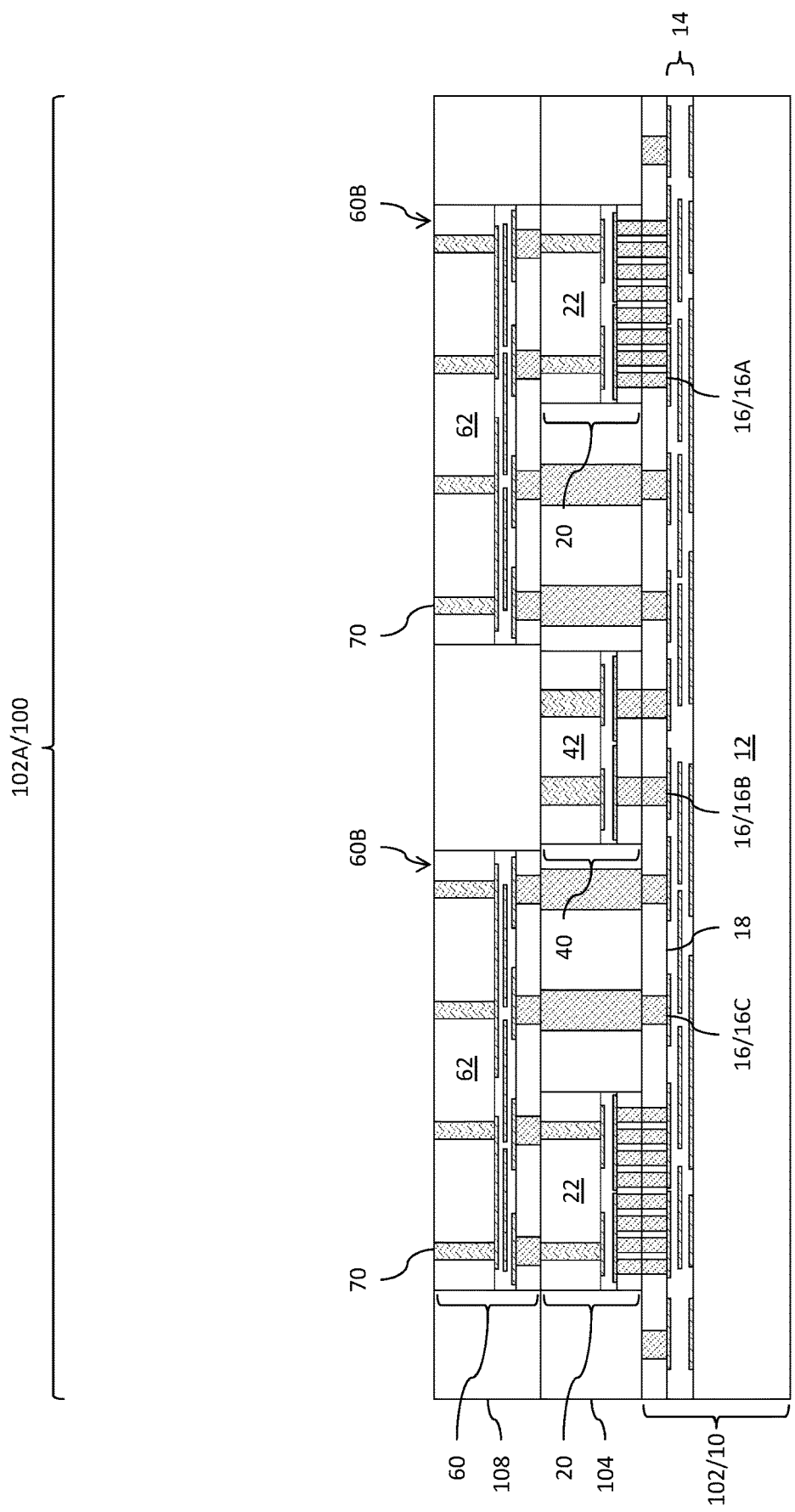

In FIG. 5, a dielectric layer 108 is formed surrounding the second memory devices 60. The dielectric layer 108 can be formed after placement of the second memory devices 60 but before annealing to complete the hybrid bonding, or can be formed after annealing. The dielectric layer 108 may be formed of a similar material and by a similar method as the dielectric layer 104. In some embodiments, the dielectric layer 108 is an oxide such as silicon oxide. A planarization process is then performed on the dielectric layer 108 and second memory devices 60. The planarization process may be, for example, a CMP process, a grinding process, an etch back process, the like, or combinations thereof. Top surfaces of the dielectric layer 108, conductive vias 70, and semiconductor substrates 62 are planar after the planarization process.

Figure 6:
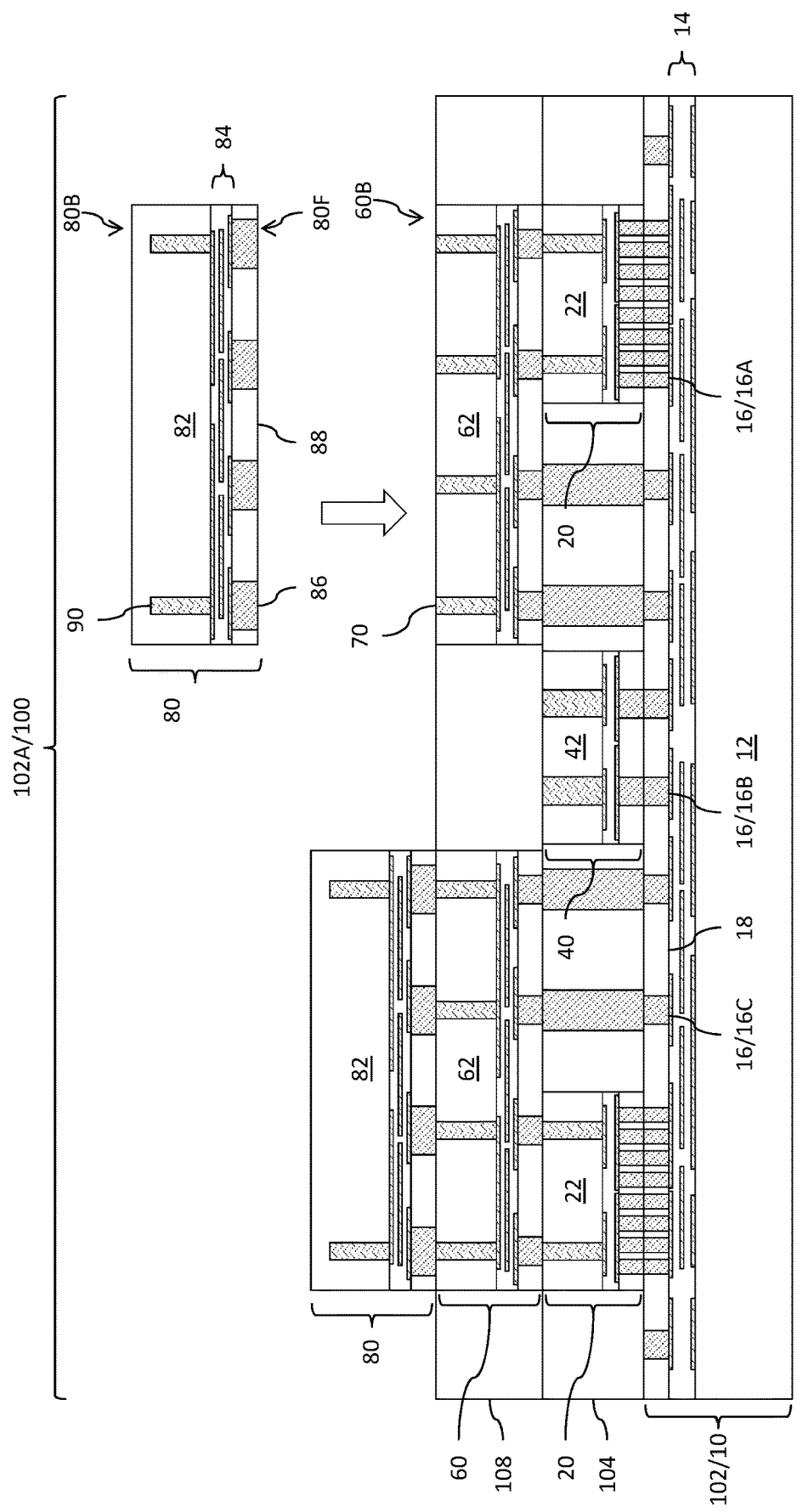

In FIG. 6, third memory devices 80 are bonded to the second memory devices 60. The third memory devices 80 can be any acceptable memory devices, such as dynamic random access memory (DRAM) devices, static random access memory (SRAM) devices, resistive random-access memory (RRAM) devices, magnetoresistive random-access memory (MRAM) devices, phase-change random-access memory (PCRAM) devices, or the like.

Each third memory device 80 may be processed according to applicable manufacturing processes to form integrated circuits. For example, the third memory device 80 includes a semiconductor substrate 82, an interconnect structure 84, die connectors 86, a dielectric layer 88, and conductive vias 90 which, respectively, can be similar to the semiconductor substrate 12, interconnect structure 14, die connectors 16, dielectric layer 18, and conductive vias 70. The die connectors 86 and dielectric layer 88 are exposed at a front side 80F of the third memory device 80. In the embodiment illustrated, the conductive vias 90 are not yet exposed at a back side 80B of the third memory device 80, but will be exposed in subsequent processing to form TSVs.

In some embodiments, the third memory devices 80 are memories for the processor device 10. For example, the third memory devices 80 can be level 3 (L3) caches for the processor device 10.

Referring to FIG. 10, the third memory devices 80 are placed over multiple processing units of the processor device 10. The third memory devices 80 are thus shared by some or all of the processing units 10A, 10B, 10C, 10D. Placing the third memory devices 80 directly over their corresponding processing units 10A, 10B, 10C, 10D allows the length of interconnections between logic devices and their corresponding memories to be reduced. The third memory devices 80 are electrically coupled to the processor device 10 through the second memory devices 60, over which control signaling and data signaling are performed. The third memory devices 80 are connected to the second memory devices 60 by direct bonds. The direct bonds are shorter than conductive vias, and so the latency and power consumption of the interconnections between the memory devices may be improved.

The third memory devices 80 and second memory devices 60 are directly bonded in a face-to-back manner by hybrid bonding, such that the back sides 60B of the second memory devices 60 are bonded to the front sides 80F of the third memory devices 80. Specifically, the semiconductor substrates 62 of the second memory devices 60 are bonded to the dielectric layers 88 of the third memory devices 80 through dielectric-to-dielectric bonding, without using any adhesive material (e.g., die attach film), and the conductive vias 70 of the second memory devices 60 are bonded to the die connectors 86 of the third memory devices 80 through metal-to-metal bonding, without using any eutectic material (e.g., solder). In some embodiments, an oxide, such as a native oxide, a thermal oxide, or the like, is formed at the back sides 60B of the second memory devices 60, such as on the semiconductor substrates 62, and is used for the dielectric-to-dielectric bonding. The hybrid bonding may be similar to the bonding of the processor device 10 and first memory devices 20, described above.

The third memory devices 80 are wider than the second memory devices 60 in some directions (see FIG. 10), and so some portions of the dielectric layer 108 also participating in the hybrid bonding. Specifically, the dielectric layers 88 of the third memory devices 80 are bonded to portions of the dielectric layer 108 through dielectric-to-dielectric bonding, without using any adhesive material (e.g., die attach film).

The third memory devices 80 have active devices of a minimum feature size in the range of about 2 nm to about 65 nm. In some embodiments, the minimum feature size of the active devices of the third memory devices 80 is larger than the minimum feature size of the active devices of the second memory devices 60. As such, the die connectors 86 of the third memory devices 80 can have a larger pitch than the pitch of the conductive vias 70 of the second memory devices 60. For example, the die connectors 86 can have a pitch in the range of about 0.5 μm to about 90 μm. The conductive vias 70 have the same pitch as the die connectors 86. Forming the die connectors 86 and the conductive vias 70 at a large pitch allows the connections between the second memory devices 60 and the third memory devices 80 to be formed at a low cost, which can be particularly advantageous when the third memory devices 80 are devices with a low complexity such as L3 cache.

Figure 7:
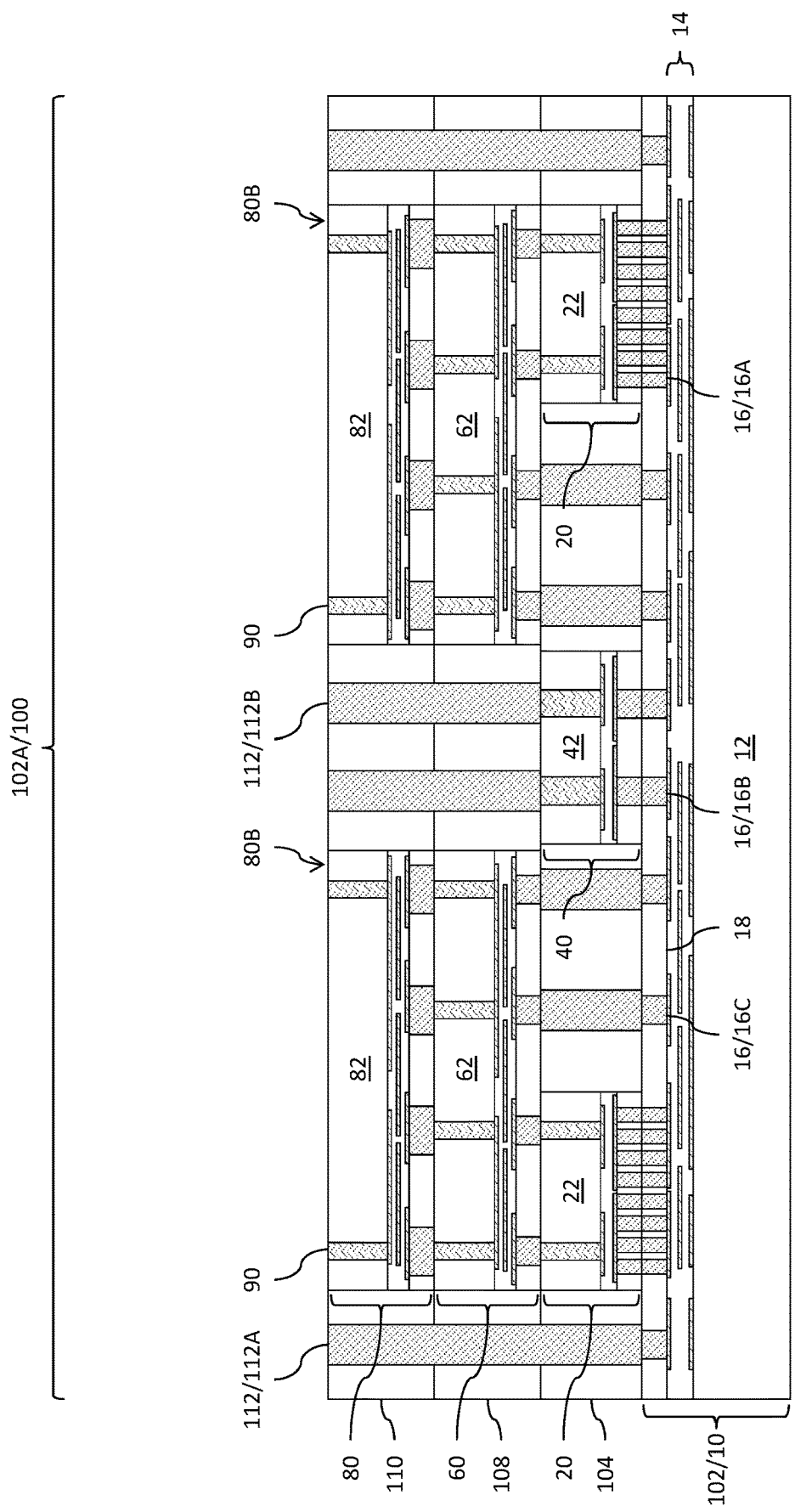

In FIG. 7, a dielectric layer 110 is formed surrounding the third memory devices 80. The dielectric layer 110 can be formed after placement of the third memory devices 80 but before annealing to complete the hybrid bonding, or can be formed after annealing. The dielectric layer 110 may be formed of a similar material and by a similar method as the dielectric layer 104. In some embodiments, the dielectric layer 110 is an oxide such as silicon oxide. A planarization process is then performed on the dielectric layer 110 and third memory devices 80. The planarization process may be, for example, a CMP process, a grinding process, an etch back process, the like, or combinations thereof. Top surfaces of the dielectric layer 110, conductive vias 90, and semiconductor substrates 82 are planar after the planarization process.

Conductive vias 112 are then formed to extend through the dielectric layers 104, 108, 110. The conductive vias 112 may be formed of a similar material and by a similar method as the conductive vias 106. A first subset of the conductive vias 112A extend through the dielectric layers 104, 108, 110, and are connected to a subset of the die connectors 16D of the processor device 10. A second subset of the conductive vias 112B extend through the dielectric layers 108, 110, and are connected to the conductive vias 50 of the passive devices 40.

In FIG. 8, a redistribution structure 114 is formed on the conductive vias 112, the dielectric layer 110, and the third memory devices 80. The redistribution structure 114 includes multiple metallization patterns among dielectric layers. For example, the redistribution structure 114 may be patterned as a plurality of discrete metallization patterns separated from each other by respective dielectric layers. In some embodiments, the dielectric layers are formed of a polymer, which may be a photo-sensitive material such as PBO, polyimide, BCB, or the like, may be patterned using a lithography mask. In other embodiments, the dielectric layers are formed of a nitride such as silicon nitride; an oxide such as silicon oxide, PSG, BSG, BPSG; or the like. The dielectric layers may be formed by spin coating, lamination, CVD, the like, or a combination thereof. After formation, the dielectric layers are patterned to expose underlying conductive features. For example, the bottom dielectric layer is patterned to expose portions of the conductive vias 90 and 112, and intermediate dielectric layer(s) are patterned to expose portions of underlying metallization patterns. The patterning may be by an acceptable process, such as by exposing the dielectrics layers to light when the dielectric layers are a photo-sensitive material, or by etching using, for example, an anisotropic etch. If the dielectric layers are photo-sensitive materials, the dielectric layers can be developed after the exposure.

Metallization patterns are formed extending along and through each dielectric layer. A seed layer (not illustrated) is formed over each respective dielectric layer and in the openings through the respective dielectric layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a deposition process, such as PVD or the like. A photoresist is then formed and patterned on the seed layer. The photoresist may be formed by spin coating or the like and may be exposed to light for patterning. The pattern of the photoresist corresponds to the metallization pattern. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal or a metal alloy, such as copper, titanium, tungsten, aluminum, the like, or combinations thereof. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern for one layer of the redistribution structure 114.

The redistribution structure 114 is illustrated as an example. More or fewer dielectric layers and metallization patterns than illustrated may be formed in the redistribution structure 114 by repeating or omitting the steps described above.

The metallization patterns of the redistribution structure 114 are connected to the conductive vias 112 and the back sides 80B of the third memory devices 80 (e.g., to the conductive vias 90). The metallization patterns of the redistribution structure 114 include power supply source ($V_{DD}$) lines and power supply ground ($V_{SS}$) lines, which are electrically coupled to the processor device 10 and passive devices 40 by the conductive vias 112 to form power delivery networks for the semiconductor devices in the integrated circuit package 100. In embodiments where the passive devices 40 are PMICs, they can be part of the power delivery network for the processor device 10. As noted above, the passive devices 40 are optional. For example, in some embodiments, the processor device 10 has built-in PMICs, and the passive devices 40 are omitted. The metallization patterns of the redistribution structure 114 also include data signal lines, which are electrically coupled to the processor device 10 by the conductive vias 112. For example, some of the conductive vias 112 couple input/output (I/O) connections of the processor device 10 to the redistribution structure 114. The processor device 10 may thus be coupled to external devices.

In FIG. 9, a singulation process is performed by sawing along scribe line regions, e.g., around the device region 102A. The singulation process includes sawing the wafer 102, the dielectric layers 104, 108, 110, and the redistribution structure 114. The singulation process separates the device region 102A (comprising the processor device 10) from adjacent device regions (not illustrated) of the wafer 102 to form an integrated circuit package 100 comprising the processor device 10. The first memory devices 20 are bonded to the processor device 10 in a face-to-face manner, the second memory devices 60 are bonded to the first memory devices 20 in a face-to-back manner, and the third memory devices 80 are bonded to the second memory devices 60 in a face-to-back manner, each without the use of solder. The resulting integrated circuit package 100 is thus free from solder. After singulation, the processor device 10, the dielectric layers 104, 108, 110, and the redistribution structure 114 are laterally coterminous.

FIG. 10 illustrates the electrical connections among the semiconductor devices of the resulting integrated circuit package 100. Some features are omitted from FIG. 10 for clarity of illustration. A pair of first memory devices 20 (e.g., an instruction cache device 20I and a data cache device 20D) are connected to each of the processing units 10A, 10B, 10C, 10D by direct bonds 118. A second memory device 60 is connected to each pair of the first memory devices 20 by direct bonds 120. A third memory device 80 is connected to multiple second memory devices 60 by direct bonds 122. Passive devices 40 are optionally connected to the processing units 10A, 10B, 10C, 10D by direct bonds 124. The second memory devices 60 are electrically coupled to the processor device 10 by the conductive vias 106. The redistribution structure 114 is electrically coupled to the processor device 10 by the conductive vias 112A, and is electrically coupled to the passive devices 40 by the conductive vias 112B.

Figure 11:
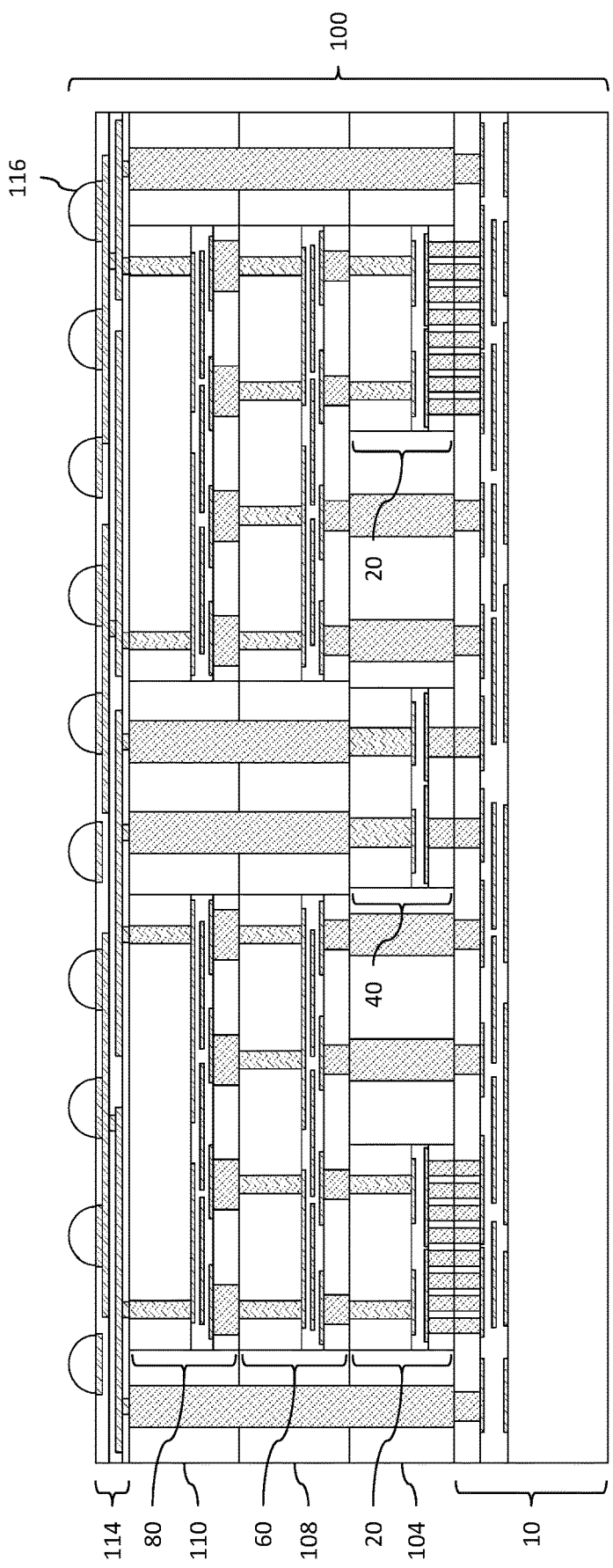
FIGS. 11 and 12 are cross-sectional views of intermediate steps during a process for forming a system implementing an integrated circuit package, in accordance with some embodiments.
Figure 12:
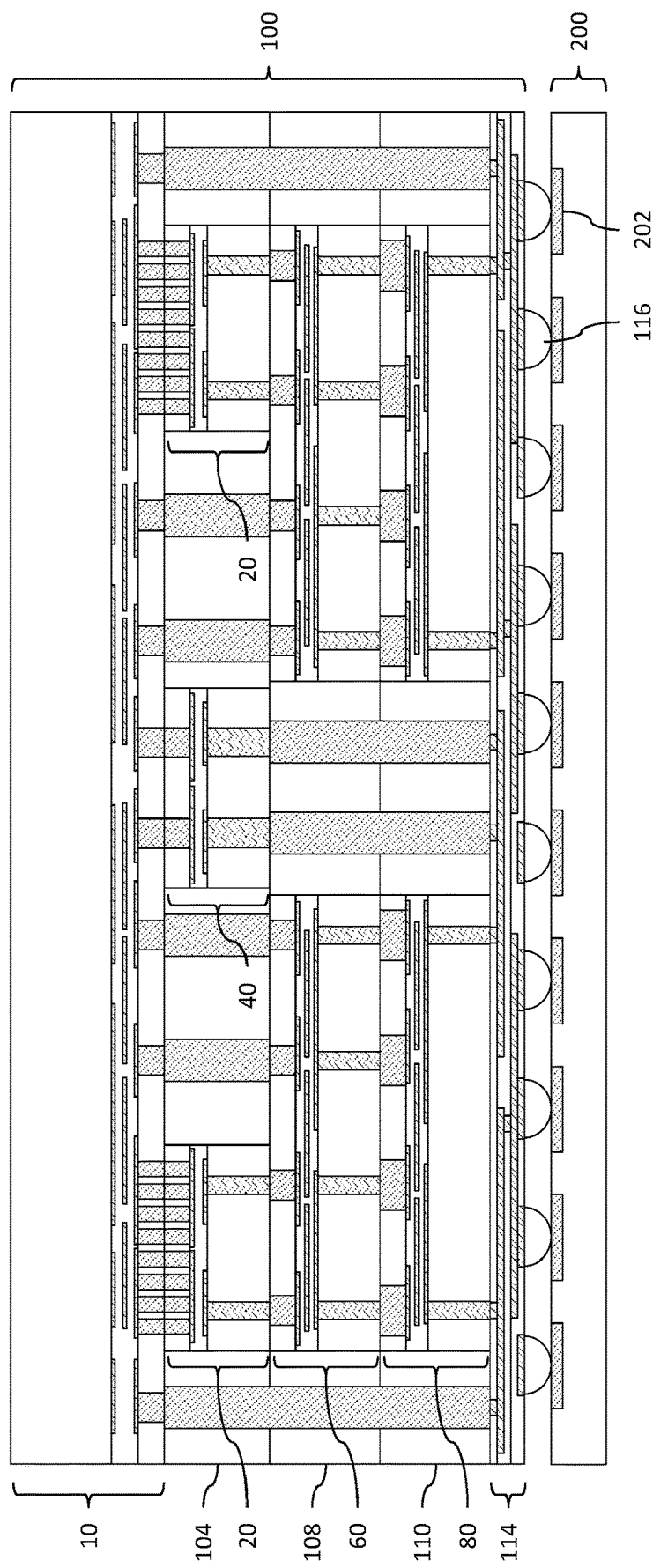

FIGS. 11 and 12 are cross-sectional views of intermediate steps during a process for forming a system implementing the integrated circuit package 100, in accordance with some embodiments. FIGS. 11 and 12 are illustrated along reference cross-section X-X in FIG. 10. In this embodiment, the integrated circuit package 100 is directly mounted to a package substrate.

In FIG. 11, conductive connectors 116 are formed electrically coupled to the metallization patterns of the redistribution structure 114. The conductive connectors 116 can be formed before or after the integrated circuit package 100 is singulated. The top dielectric layer of the redistribution structure 114 may be patterned to expose portions of the underlying metallization patterns. In some embodiments, under bump metallurgies (UBMs) may be formed in the openings. The conductive connectors 116 are formed on the UBMs. The conductive connectors 116 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 116 may be formed of a metal or metal alloy, such as solder, copper, aluminum, gold, nickel, silver, palladium, tin, the like, or a combination thereof. In some embodiments, the conductive connectors 116 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 116 are metal pillars (such as a copper pillar) formed by a sputtering, printing, electro plating, electroless plating, CVD, or the like. The metal pillars may be solder free and have substantially vertical sidewalls. The conductive connectors 116 are electrically coupled to the metallization patterns of the redistribution structure 114.

In FIG. 12, the integrated circuit package 100 is flipped and attached to a package substrate 200 using the conductive connectors 116. The package substrate 200 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 200 may be a SOI substrate. Generally, an SOI substrate includes a layer of a semiconductor material such as epitaxial silicon, germanium, silicon germanium, SOI, SGOI, or combinations thereof. The package substrate 200 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for package substrate 200.

The package substrate 200 may include active and passive devices (not illustrated). Devices such as transistors, capacitors, resistors, combinations of these, and the like may be used to generate the structural and functional requirements of the design for the system. The devices may be formed using any suitable methods.

The package substrate 200 may also include metallization layers and vias (not illustrated) and bond pads 202 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 200 is substantially free of active and passive devices.

The conductive connectors 116 are reflowed to attach the UBMs of the redistribution structure 114 to the bond pads 202. The conductive connectors 116 electrically and/or physically connect the package substrate 200, including metallization layers in the package substrate 200, to the integrated circuit package 100. In some embodiments, passive devices (e.g., surface mount devices (SMDs), not illustrated) may be attached to the integrated circuit package 100 (e.g., bonded to the bond pads 202) prior to mounting on the package substrate 200. In such embodiments, the passive devices may be bonded to a same surface of the integrated circuit package 100 as the conductive connectors 116. In some embodiments, passive devices (e.g., SMDs, not illustrated) may be attached to the package substrate 200, e.g., to the bond pads 202.

The conductive connectors 116 may have an epoxy flux (not illustrated) formed thereon before they are reflowed with at least some of the epoxy portion of the epoxy flux remaining after the integrated circuit package 100 is attached to the package substrate 200. This remaining epoxy portion may act as an underfill to reduce stress and protect the joints resulting from the reflowing the conductive connectors 116. In some embodiments, an underfill (not illustrated) may be formed between the integrated circuit package 100 and the package substrate 200, surrounding the conductive connectors 116. The underfill may be formed by a capillary flow process after the integrated circuit package 100 is attached or may be formed by a suitable deposition method before the integrated circuit package 100 is attached.

FIGS. 13 through 17 are cross-sectional views of intermediate steps during a process for forming a system implementing the integrated circuit package 100, in accordance with some other embodiments. FIGS. 13 through 17 are illustrated along reference cross-section X-X in FIG. 10. In this embodiment, the integrated circuit package 100 is singulated and included in a package component. Packaging of devices in one package region 302A is illustrated, but it should be appreciated that any number of package regions may be simultaneously formed. The package region 302A will be singulated in subsequent processing. The singulated package component may be a fan-out package, such as an integrated fan-out (InFO) package. The fan-out package is then mounted to a package substrate.

Figure 13:
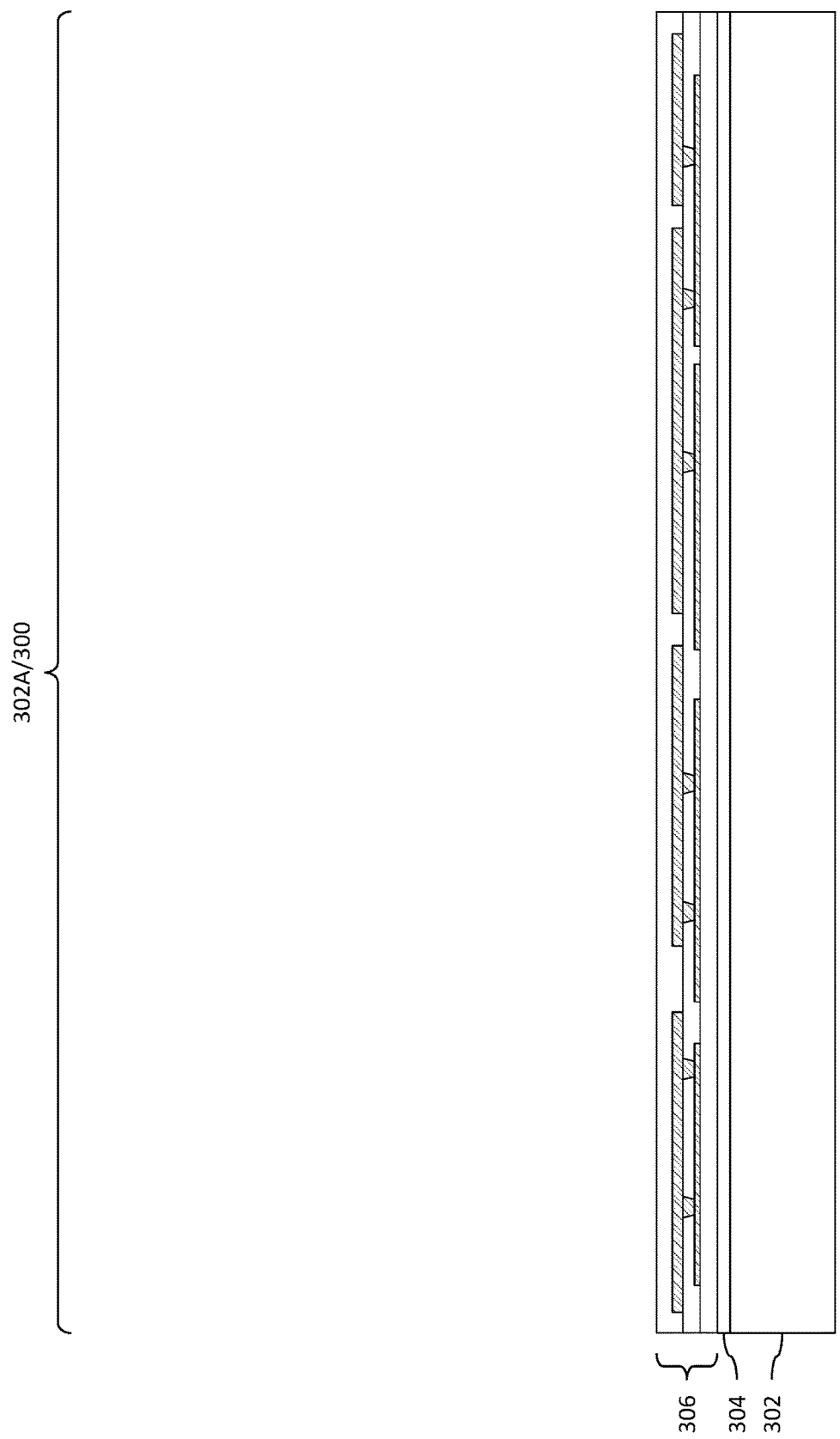
FIGS. 13, 14, 15, 16, and 17 are cross-sectional views of intermediate steps during a process for forming a system implementing an integrated circuit package, in accordance with some other embodiments.

In FIG. 13, a carrier substrate 302 is provided, and a release layer 304 is formed on the carrier substrate 302. The carrier substrate 302 may be a glass carrier substrate, a ceramic carrier substrate, or the like. The carrier substrate 302 may be a wafer, such that multiple packages can be formed on the carrier substrate 302 simultaneously. The release layer 304 may be formed of a polymer-based material, which may be removed along with the carrier substrate 302 from the overlying structures that will be formed in subsequent steps. In some embodiments, the release layer 304 is an epoxy-based thermal-release material, which loses its adhesive property when heated, such as a light-to-heat-conversion (LTHC) release coating. In other embodiments, the release layer 304 may be an ultra-violet (UV) glue, which loses its adhesive property when exposed to UV lights. The release layer 304 may be dispensed as a liquid and cured, may be a laminate film laminated onto the carrier substrate 302, or may be the like. The top surface of the release layer 304 may be leveled and may have a high degree of planarity.

A redistribution structure 306 may be formed on the release layer 304. The redistribution structure 306 can be formed in a similar manner and of similar materials as the redistribution structure 114 described with respect to FIG. 8. The redistribution structure 306 includes dielectric layers and metallization patterns (sometimes referred to as redistribution layers or redistribution lines). More or fewer dielectric layers and metallization patterns than illustrated may be formed in the redistribution structure 306. The redistribution structure 306 is optional. In some embodiments, a dielectric layer without metallization patterns is formed on the release layer 304 in lieu of the redistribution structure 306.

Figure 14:
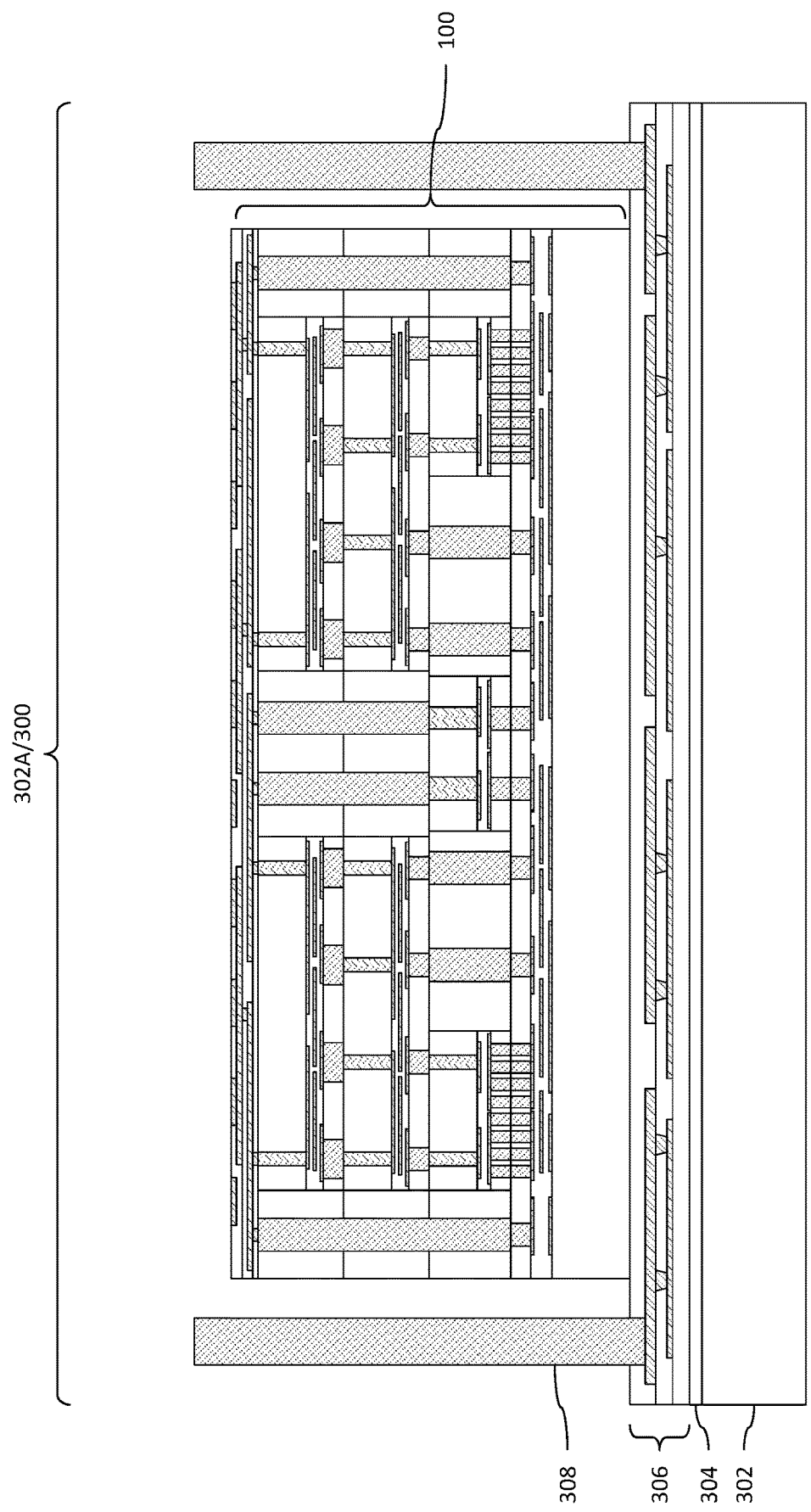

In FIG. 14, conductive vias 308 are formed extending through the topmost dielectric layer of the redistribution structure 306. Thus, the conductive vias 308 are connected to the metallization patterns of the redistribution structure 306. The conductive vias 308 are optional, and may be omitted. For example, the conductive vias 308 may (or may not) be omitted in embodiments where the redistribution structure 306 is omitted.

As an example to form the conductive vias 308, openings can be formed in the topmost dielectric layer of the redistribution structure 306. A seed layer is then formed over the redistribution structure 306, e.g., on the topmost dielectric layer of the redistribution structure 306 and portions of the metallization pattern of the redistribution structure 306 exposed by the openings. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive vias 308.

A singulated integrated circuit package 100 is placed on the redistribution structure 306. To form the singulated integrated circuit package 100, an intermediate structure similar to that described with respect to FIG. 9 is obtained. As noted above, in the integrated circuit package 100, the devices are bonded to one another without the use of solder. The singulated integrated circuit package 100 is thus free from solder.

Figure 15:
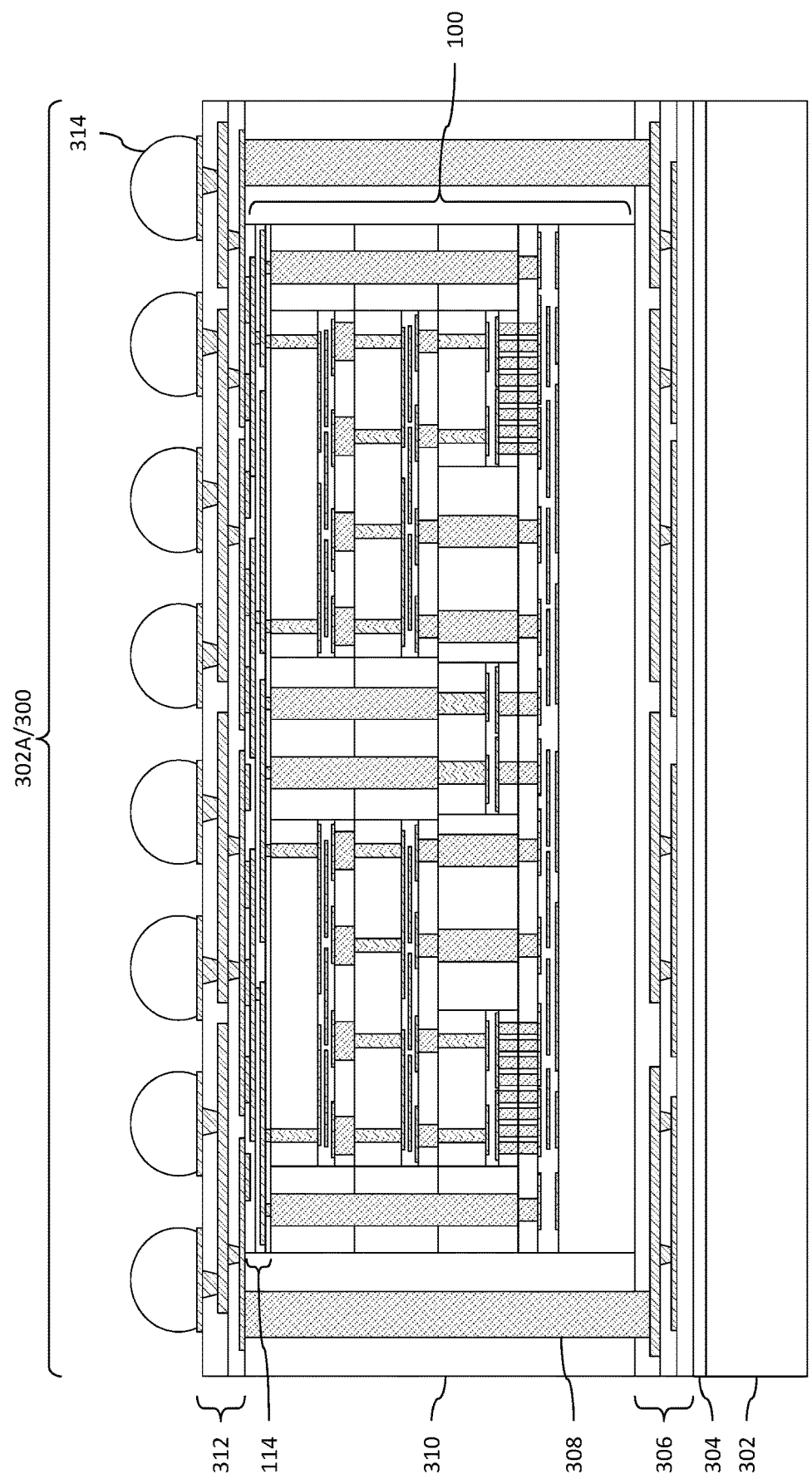

In FIG. 15, an encapsulant 310 is formed around the integrated circuit package 100. The encapsulant 310 laterally surrounds the integrated circuit package 100. The encapsulant 310 may be a molding compound, epoxy, or the like. The encapsulant 310 may be applied by compression molding, transfer molding, or the like, and may be applied in liquid or semi-liquid form and then subsequently cured.

In some embodiments, the encapsulant 310 is formed over the integrated circuit package 100 such that the redistribution structure 114 is buried or covered. A planarization process may be performed on the encapsulant 310 to expose the integrated circuit package 100. The planarization process can remove material of the encapsulant 310 until the redistribution structure 114 is exposed. Top surfaces of the encapsulant 310 and redistribution structure 114 are coplanar after the planarization process. The planarization process may be, for example, a CMP process, a grinding process, an etch back process, the like, or combinations thereof. In other embodiments, the encapsulant 310 is not formed over the integrated circuit package 100, and no planarization process is necessary to expose the integrated circuit package 100.

A redistribution structure 312 is then formed on the encapsulant 310 and the redistribution structure 114. The redistribution structure 312 can be formed in a similar manner and of similar materials as the redistribution structure 114 described with respect to FIG. 8. The redistribution structure 312 includes dielectric layers and metallization patterns (sometimes referred to as redistribution layers or redistribution lines). More or fewer dielectric layers and metallization patterns than illustrated may be formed in the redistribution structure 306. A bottom dielectric layer of the redistribution structure 312 physically contacts the encapsulant 310 and a top dielectric layer of the redistribution structure 114. The metallization patterns of the redistribution structure 312 are electrically coupled to the metallization patterns of the redistribution structure 114.

Conductive connectors 314 are formed physically and electrically connected to the metallization patterns of the redistribution structure 312. The conductive connectors 314 can be formed in a similar manner and of similar materials as the conductive connectors 116 described with respect to FIG. 11.

Figure 16:
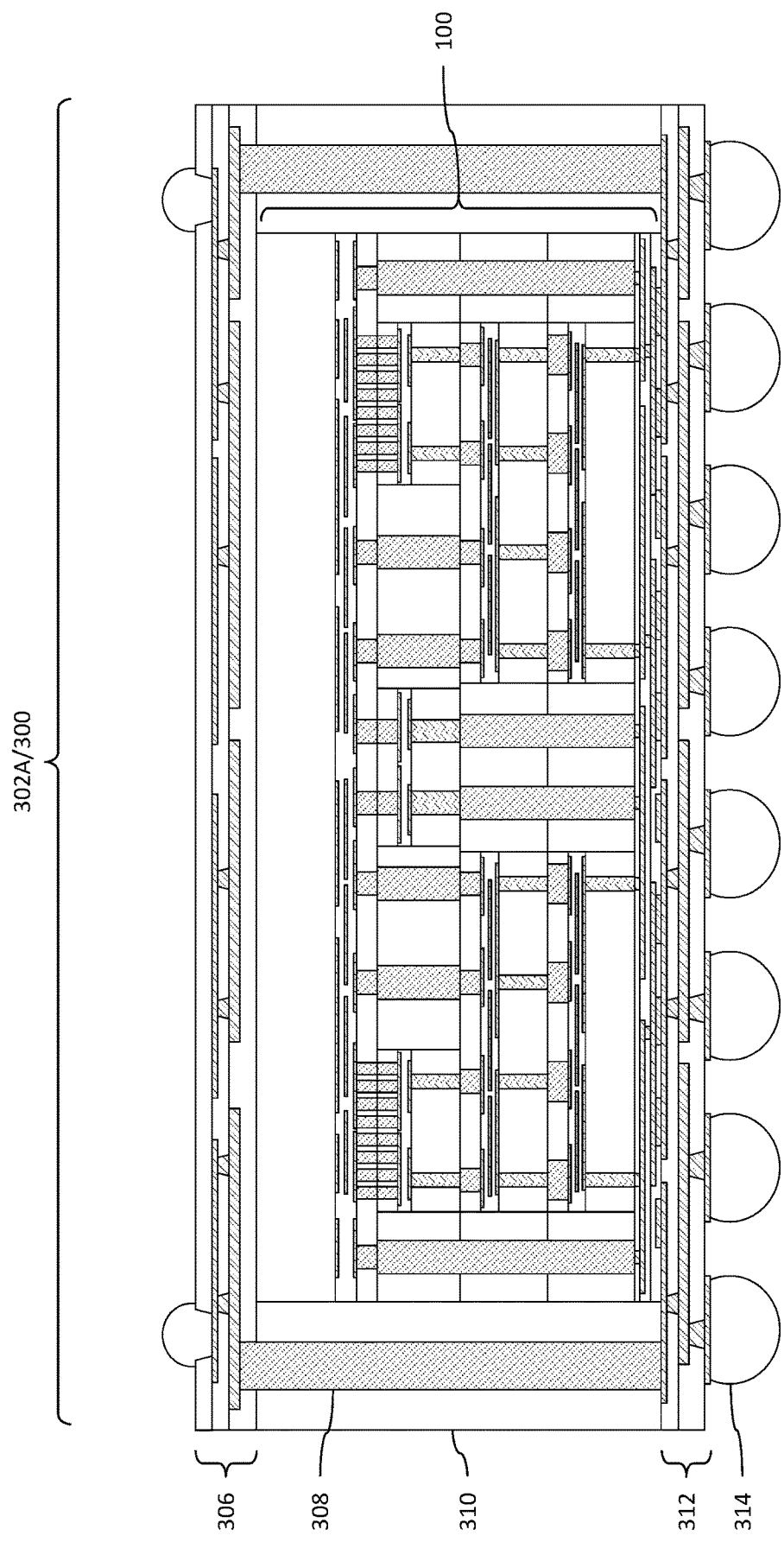

In FIG. 16, a carrier substrate debonding is performed to detach (de-bond) the carrier substrate 302 from the redistribution structure 306, e.g., the bottommost dielectric layer of the redistribution structure 306. In accordance with some embodiments, the de-bonding includes projecting a light such as a laser light or an UV light on the release layer 304 so that the release layer 304 decomposes under the heat of the light and the carrier substrate 302 can be removed. The structure can then be flipped over and placed on, e.g., a tape.

Further, conductive connectors 316 are formed through the bottommost dielectric layer of the redistribution structure 306. Openings can be formed through the bottommost dielectric layer of the redistribution structure 306, exposing portions of the metallization patterns of the redistribution structure 306. The openings may be formed, for example, using laser drilling, etching, or the like. The conductive connectors 316 are formed in the openings, and are connected to exposed portions of the metallization patterns of the redistribution structure 306. The conductive connectors 316 can be formed in a similar manner and of similar materials as the conductive connectors 116 described with respect to FIG. 11.

Figure 17:
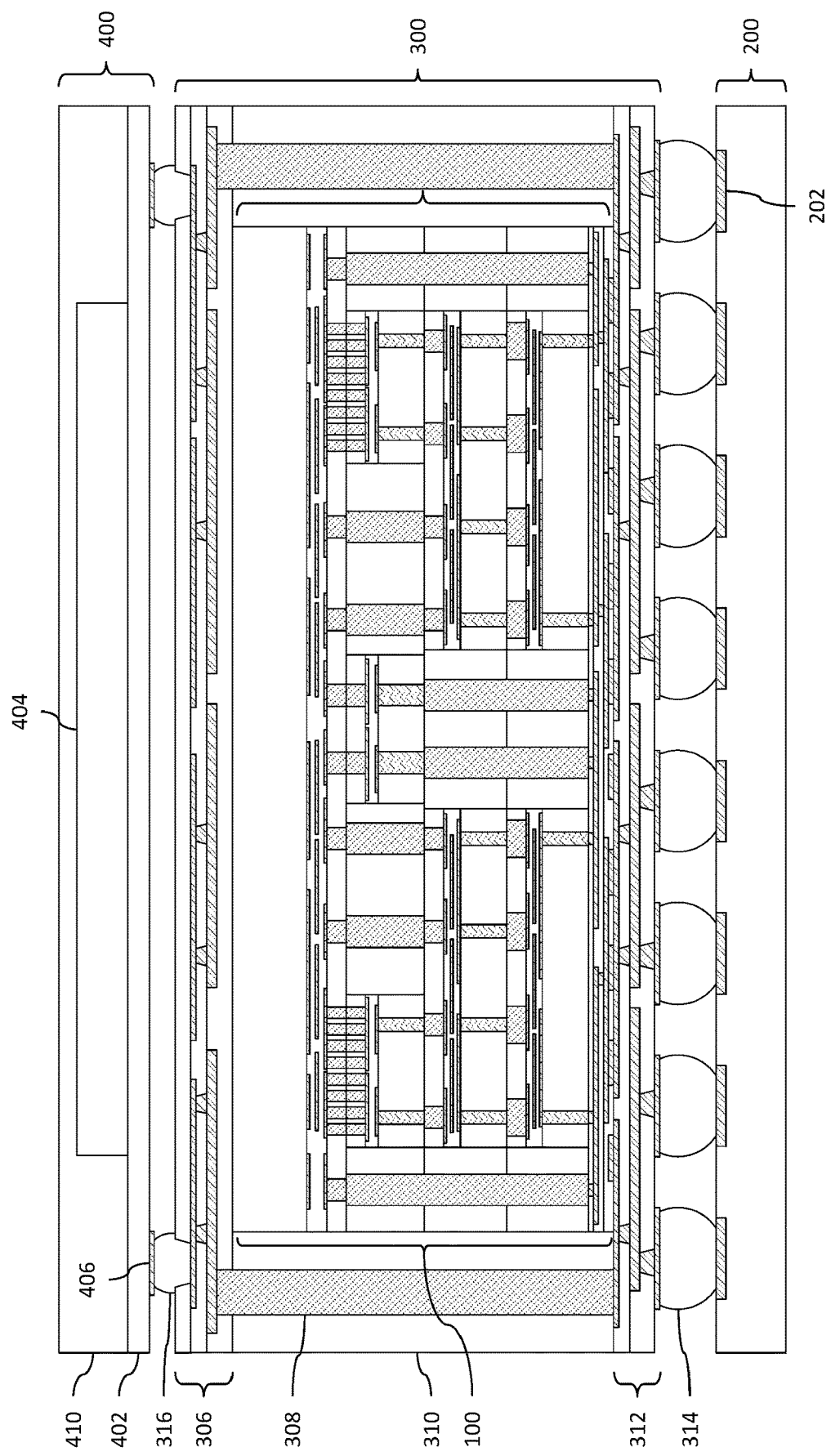

In FIG. 17, a singulation process is performed by sawing along scribe line regions, e.g., around the package region 302A. The singulation process includes sawing the redistribution structures 306, 312 and encapsulant 310. The singulation process separates the package region 302A from adjacent package regions (not illustrated) to form an integrated circuit package 300. After singulation, the redistribution structures 306, 312 and the encapsulant 310 are laterally coterminous.

Another integrated circuit package 400 can be attached to the integrated circuit package 300 to form a package-on-package structure. The integrated circuit package 400 may be a memory package. The integrated circuit package 400 can be attached to the integrated circuit package 300 before or after the integrated circuit package 300 is singulated. The integrated circuit package 400 includes a substrate 402 and one or more dies 404 connected to the substrate 402. In some embodiments (not shown) one or more stacks of dies 404 are connected to the substrate 402. The substrate 402 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 402 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 402 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 402.

The substrate 402 may include active and passive devices (not shown). As one of ordinary skill in the art will recognize, a wide variety of devices such as transistors, capacitors, resistors, combinations of these, and the like may be used to generate the structural and functional requirements of the design for the integrated circuit package 400. The devices may be formed using any suitable methods. The substrate 402 may also include metallization layers (not shown) and through vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 402 is substantially free of active and passive devices.

The substrate 402 may have bond pads 406 on a side the substrate 402, to connect to the conductive connectors 316. In some embodiments, the bond pads 406 are formed by forming recesses (not shown) into dielectric layers (not shown) on the side of the substrate 402. The recesses may be formed to allow the bond pads 406 to be embedded into the dielectric layers. In other embodiments, the recesses are omitted as the bond pads 406 may be formed on the dielectric layer. In some embodiments, the bond pads 406 include a thin seed layer (not shown) made of copper, titanium, nickel, gold, palladium, the like, or a combination thereof. The conductive material of the bond pads 406 may be deposited over the thin seed layer. The conductive material may be formed by an electro-chemical plating process, an electroless plating process, CVD, ALD, PVD, the like, or a combination thereof. In an embodiment, the conductive material of the bond pads 406 is copper, tungsten, aluminum, silver, gold, the like, or a combination thereof.

In an embodiment, the bond pads 406 are UBMs that include three layers of conductive materials, such as a layer of titanium, a layer of copper, and a layer of nickel. For example, the bond pads 406 may be formed from copper, may be formed on a layer of titanium (not shown), and have a nickel finish, which may improve the shelf life of the integrated circuit package 400, which may be particularly advantageous when the integrated circuit package 400 is a memory device such as a DRAM module. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the bond pads 406. Any suitable materials or layers of material that may be used for the bond pads 406 are fully intended to be included within the scope of the current application.

In the illustrated embodiment, the dies 404 are connected to the substrate 402 by conductive bumps, although other connections may be used, such as wire bonds. In an embodiment, the dies 404 are stacked memory dies. For example, the dies 404 may be memory dies such as low-power (LP) double data rate (DDR) memory modules, such as LPDDR1, LPDDR2, LPDDR3, LPDDR4, or the like.

The dies 404 and the wire bonds (when present) may be encapsulated by a molding material 410. The molding material 410 may be molded on the dies 404 and the wire bonds, for example, using compression molding. In some embodiments, the molding material 410 is a molding compound, a polymer, an epoxy, silicon oxide filler material, the like, or a combination thereof. A curing process may be performed to cure the molding material 410; the curing process may be a thermal curing, a UV curing, the like, or a combination thereof. In some embodiments, the dies 404 are buried in the molding material 410, and after the curing of the molding material 410, a planarization step, such as a grinding, is performed to remove excess portions of the molding material 410 and provide a substantially planar surface for the integrated circuit package 400.

After the integrated circuit package 400 is formed, the integrated circuit package 400 is attached to the integrated circuit package 300 by way of the conductive connectors 316. The conductive connectors 316 can be connected to the bond pads 406 by reflowing the conductive connectors 316. The dies 404 may thus be electrically coupled to the integrated circuit package 100 through the conductive connectors 316, the conductive vias 308, and the redistribution structures 306, 312.

In some embodiments, a solder resist (not shown) is formed on the side of the substrate 402 opposing the dies 404. The conductive connectors 316 may be disposed in openings in the solder resist to be connected to conductive features (e.g., the bond pads 406) in the substrate 402. The solder resist may be used to protect areas of the substrate 402 from external damage.

In some embodiments, the conductive connectors 316 have an epoxy flux (not shown) formed thereon before they are reflowed with at least some of the epoxy portion of the epoxy flux remaining after the integrated circuit package 400 is attached to the redistribution structure 306.

In some embodiments, an underfill (not shown) is formed between the redistribution structure 306 and the substrate 402, and surrounding the conductive connectors 316. The underfill may reduce stress and protect the joints resulting from the reflowing of the conductive connectors 316. The underfill may be formed by a capillary flow process after the integrated circuit package 400 is attached or may be formed by a suitable deposition method before the integrated circuit package 400 is attached. In embodiments where the epoxy flux is formed, it may act as the underfill.

The package-on-package structure is then flipped and attached to a package substrate 200 using the conductive connectors 314. The package substrate 200 may be similar to the package substrate 200 described with respect to FIG. 12. For example, the package substrate 200 can include bond pads 202, which are connected to the conductive connectors 314.

Figure 22:
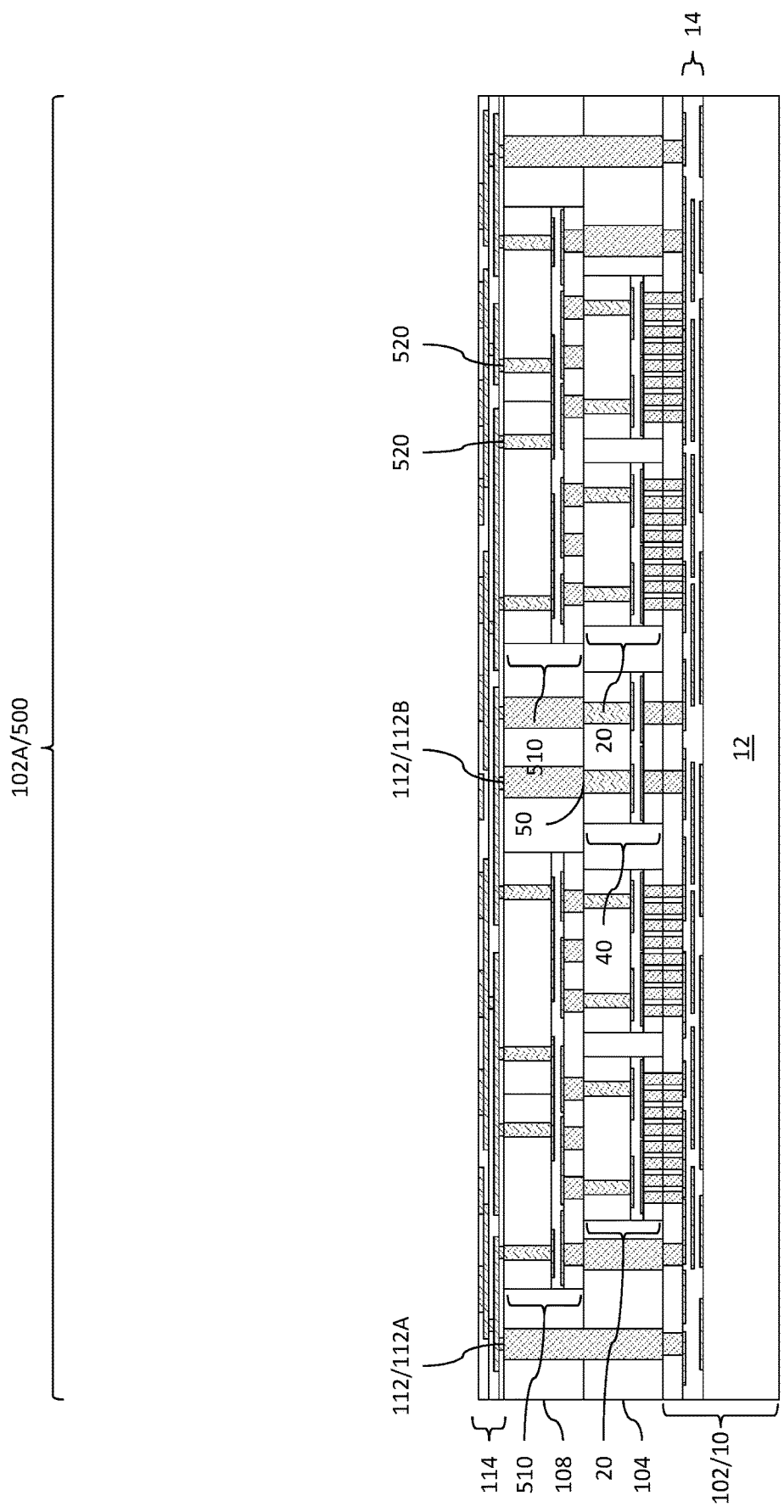
Figure 23:
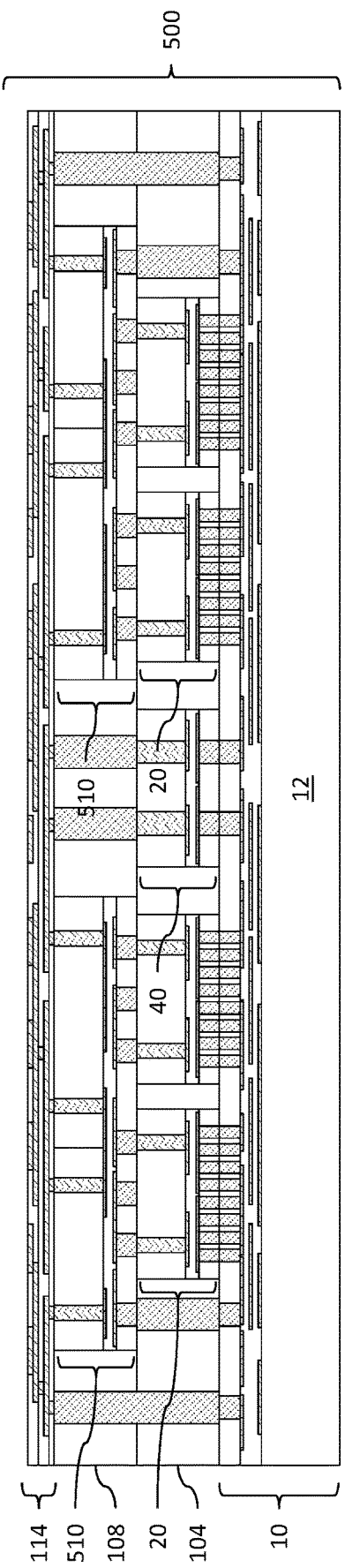
Figure 24:
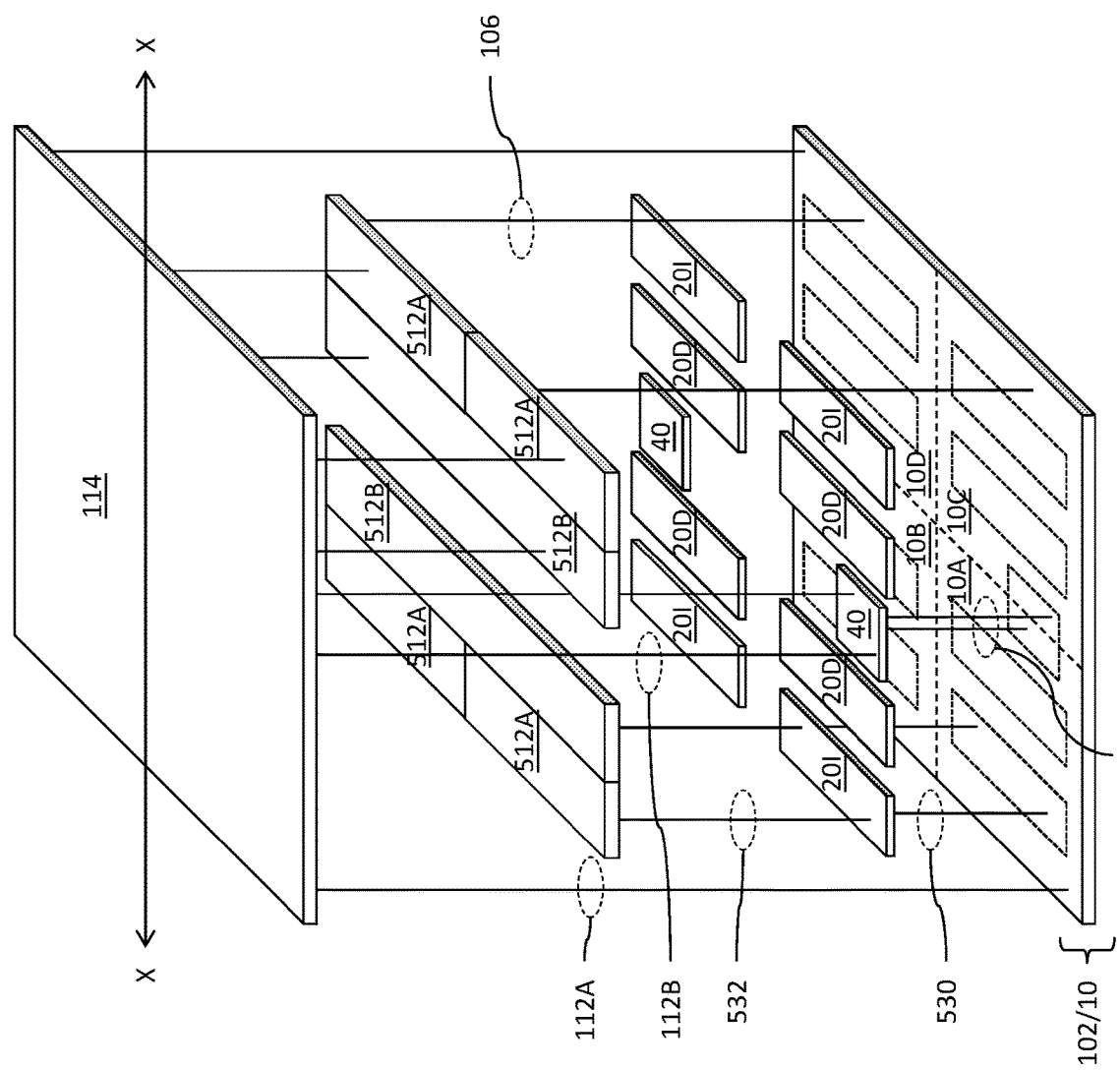

FIGS. 18 through 24 are various views of intermediate steps during a process for forming an integrated circuit package 500, in accordance with some other embodiments. FIGS. 18 through 23 are cross-sectional views of the integrated circuit package 500, and FIG. 24 is a three-dimensional diagram illustrating electrical connections among the semiconductor devices of the integrated circuit package 500, where the cross-sectional views are illustrated along reference cross-section X-X in FIG. 24. Some features are omitted from FIG. 24 for clarity of illustration. In this embodiment, some of the memory devices are combined so that a single memory device can be used to provide both L2 and L3 caches for a processing unit. The quantity of device layers in the integrated circuit package 500 may thus be reduced.

Figure 18:
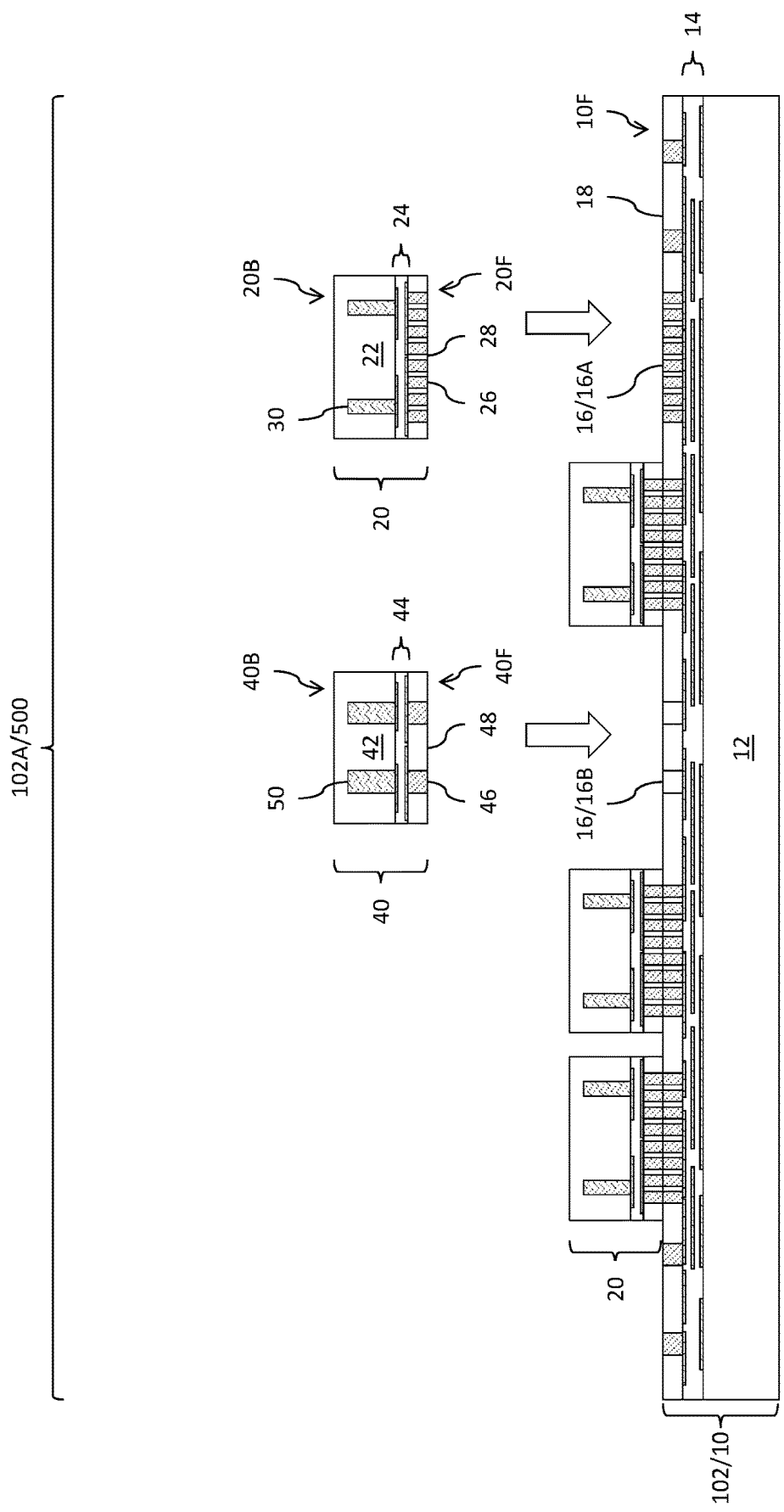
FIGS. 18 through 24 are various views of intermediate steps during a process for forming an integrated circuit package, in accordance with some other embodiments.

In FIG. 18, a wafer 102 is obtained. The wafer 102 is similar to that discussed with respect to FIG. 1, and comprises a processor device 10 in the device region 102A.

First memory devices 20 are then bonded to the processor device 10 (e.g., the wafer 102). The first memory devices 20 are similar to those discussed with respect to FIG. 2, and can be L1 caches for the processor device 10. Referring to FIG. 24, two of the first memory devices 20, such as an instruction cache device 20I (e.g., a L1i cache) and a data cache device 20D (e.g., a L1d cache), can be bonded to each of the processing units 10A, 10B, 10C, 10D of the processor device 10.

The processor device 10 and first memory devices 20 are directly bonded in a face-to-face manner by hybrid bonding, such that the front side 10F of the processor device 10 is bonded to the front sides 20F of the first memory devices 20. Specifically, the dielectric layer 18 of the processor device 10 is bonded to the dielectric layers 28 of the first memory devices 20 through dielectric-to-dielectric bonding, without using any adhesive material (e.g., die attach film), and a subset of the die connectors 16A of the processor device 10 are bonded to the die connectors 26 of the first memory devices 20 through metal-to-metal bonding, without using any eutectic material (e.g., solder).

Optionally, passive devices 40 are also bonded to the processor device 10 (e.g., the wafer 102). The passive devices 40 are similar to those discussed with respect to FIG. 2, and can be part of the power delivery network for the processor device 10. Referring to FIG. 24, the passive devices 40 can be shared by some or all of the processing units 10A, 10B, 10C, 10D of the processor device 10.

The processor device 10 and passive devices 40 are directly bonded in a face-to-face manner by hybrid bonding, such that the front side 10F of the processor device 10 is bonded to the front sides 40F of the passive devices 40. Specifically, the dielectric layer 18 of the processor device 10 is bonded to the dielectric layers 28 of the passive devices 40 through dielectric-to-dielectric bonding, without using any adhesive material (e.g., die attach film), and a subset of the die connectors 16B of the processor device 10 are bonded to the die connectors 46 of the passive devices 40 through metal-to-metal bonding, without using any eutectic material (e.g., solder).

Figure 19:
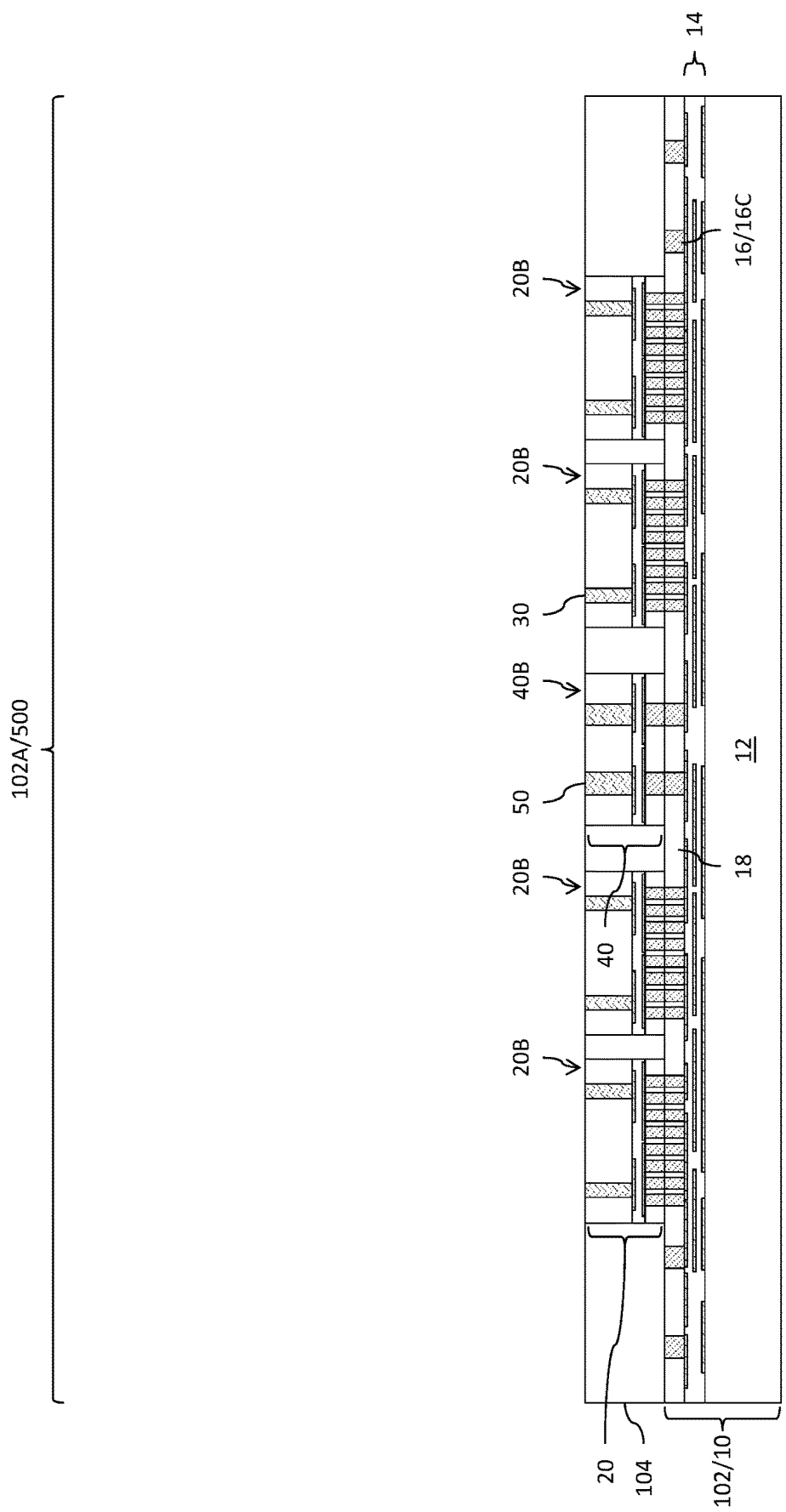

In FIG. 19, a dielectric layer 104 is formed surrounding the first memory devices 20 and passive devices 40. The dielectric layer 104 is similar to that discussed with respect to FIG. 3, and can be formed in a similar manner. Conductive vias 106 are then formed to extend through the dielectric layer 104. The conductive vias 106 are similar to those discussed with respect to FIG. 3, and can be formed in a similar manner. The conductive vias 106 are connected to a subset of the die connectors 16C of the processor device 10. A planarization process is performed to expose the conductive vias 30 and 50.

Figure 20:
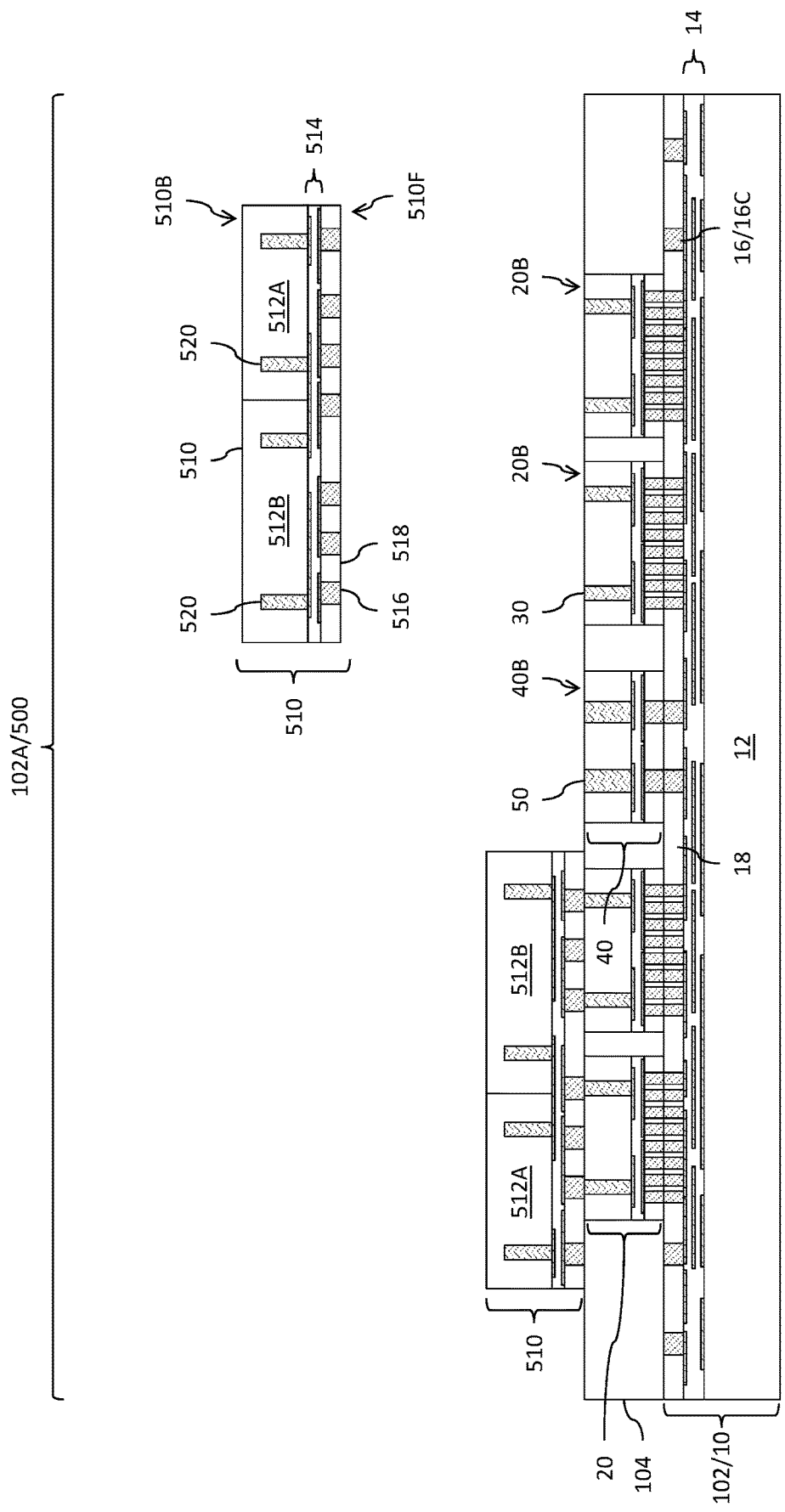

In FIG. 20, combination memory devices 510 are bonded to the first memory devices 20 and the conductive vias 106. The combination memory devices 510 provide multiple types of memories for the processor device 10. For example, the combination memory devices 510 can be both L2 and L3 caches for the processor device 10.

Each combination memory device 510 may be processed according to applicable manufacturing processes to form integrated circuits. For example, the combination memory device 510 includes a semiconductor substrate 512. The semiconductor substrate 512 can be similar to the semiconductor substrate 12 (see FIG. 2), but includes two memory regions 512A, 512B. The memory regions 512A, 512B include the different types of memory, such as L2 and L3 caches, respectively. The combination memory device 510 further includes an interconnect structure 514, die connectors 516, a dielectric layer 518, and conductive vias 520 which, respectively, can be similar to the interconnect structure 14, die connectors 16, dielectric layer 18, and conductive vias 30 (see FIG. 2). The die connectors 516 and dielectric layer 518 are exposed at a front side 510F of the combination memory device 510. In the embodiment illustrated, the conductive vias 520 are not yet exposed at a back side 510B of the combination memory device 510, but will be exposed in subsequent processing to form TSVs.

The processor device 10 and combination memory devices 510 are directly bonded in a face-to-back manner by hybrid bonding, such that the back sides 20B of the first memory devices 20 are bonded to the front sides 510F of the combination memory devices 510. Specifically, the semiconductor substrates 22 of the first memory devices 20 are bonded to the dielectric layers 518 of the combination memory devices 510 through dielectric-to-dielectric bonding, without using any adhesive material (e.g., die attach film), and the conductive vias 30 of the first memory devices 20 are bonded to the die connectors 516 of the combination memory devices 510 through metal-to-metal bonding, without using any eutectic material (e.g., solder). Some portions of the conductive vias 106 and dielectric layer 104 also participating in the hybrid bonding. Specifically, the dielectric layers 518 of the combination memory devices 510 are bonded to portions of the dielectric layer 104 through dielectric-to-dielectric bonding, without using any adhesive material (e.g., die attach film). Likewise, the die connectors 516 of the combination memory devices 510 are bonded to the conductive vias 106 through metal-to-metal bonding, without using any eutectic material (e.g., solder).

Referring to FIG. 24, the combination memory devices 510 can be shared by some or all of the processing units 10A, 10B, 10C, 10D of the processor device 10 The combination memory devices 510 each include a plurality of memory regions 512A and a memory region 512B. Specifically, the combination memory device 510 includes a memory region 512A for each processing unit it is bonded to. In the embodiment shown, each combination memory device 510 is bonded to two processing units and thus includes two memory regions 512A. As noted above, the memory regions 512A can include L2 caches and the memory region 512B can include a L3 cache. The memory region 512B of each combination memory device 510 can be electrically coupled to the memory regions 512A of the combination memory device by the interconnect structure 514. The combination memory devices 510 are electrically coupled to the processor device 10 by the conductive vias 106, over which control signaling may be performed. The combination memory devices 510 are also connected to the first memory devices 20 by direct bonds, over which data signaling is performed.

The combination memory devices 510 have active devices of a minimum feature size in the range of about 2 nm to about 65 nm. In some embodiments, the minimum feature size of the active devices of the combination memory devices 510 is larger than the minimum feature size of the active devices of the first memory devices 20. As such, the die connectors 516 of the combination memory devices 510 can have a larger pitch than the pitch of the die connectors 26 of the first memory devices 20. For example, the die connectors 516 can have a pitch in the range of about 0.3 μm to about 90 μm. The conductive vias 30 and 106 have the same pitch as the die connectors 516. Forming the die connectors 516 and the conductive vias 30 and 106 at a large pitch allows the connections between the first memory devices 20 and the combination memory devices 510 to be formed at a low cost, which can be particularly advantageous when the combination memory devices 510 are devices with a low complexity such as L2/L3 caches.

Figure 21:
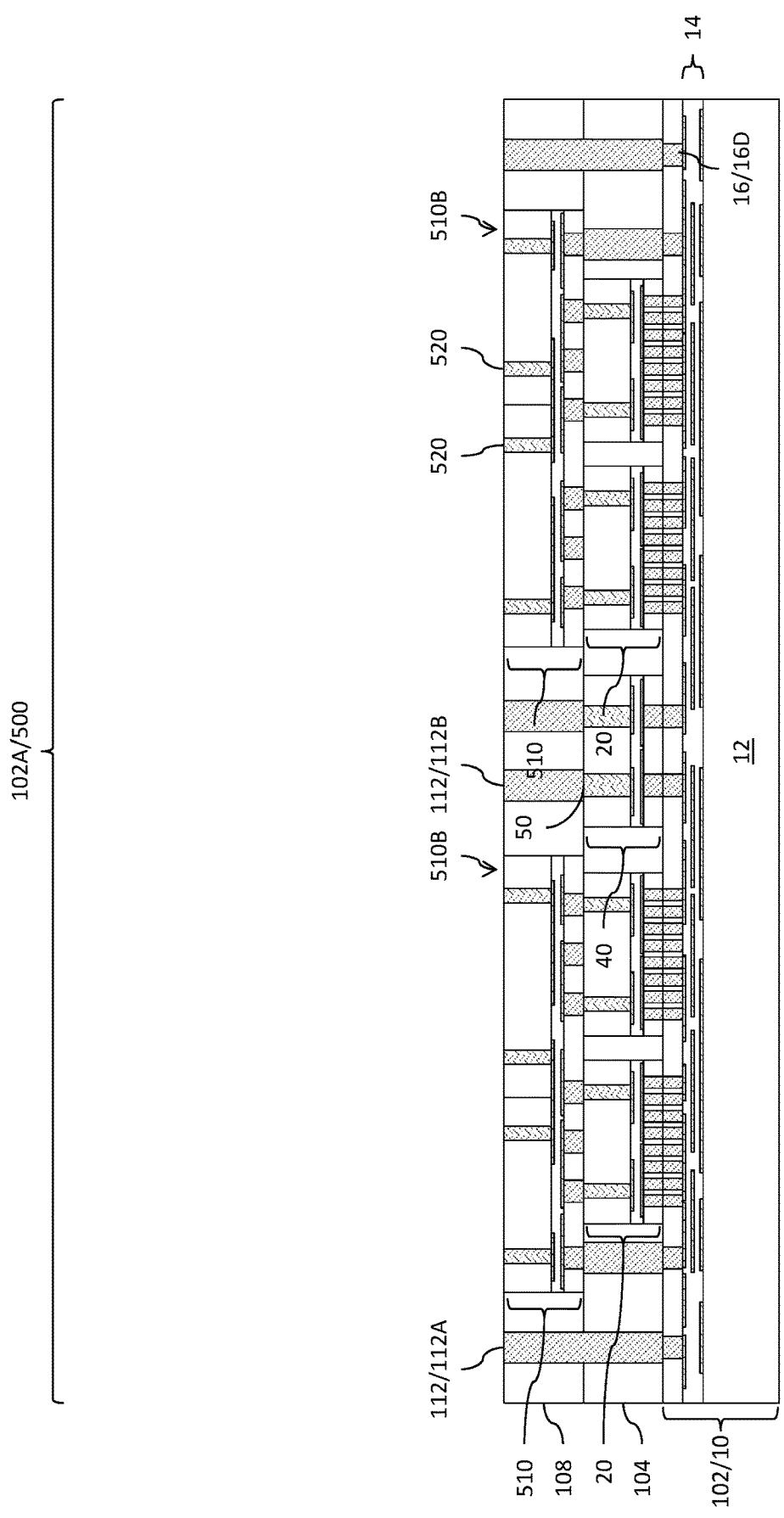

In FIG. 21, a dielectric layer 108 is formed surrounding the combination memory devices 510. The dielectric layer 108 is similar to that discussed with respect to FIG. 5, and can be formed in a similar manner. Conductive vias 112 are then formed to extend through the dielectric layers 104, 108. The conductive vias 112 are similar to those discussed with respect to FIG. 7, and can be formed in a similar manner. A first subset of the conductive vias 112A extend through the dielectric layers 104, 108, and are connected to a subset of the die connectors 16D of the processor device 10. A second subset of the conductive vias 112B extend through the dielectric layer 108, and are connected to the conductive vias 50 of the passive devices 40. A planarization process is performed to expose the conductive vias 520.

In FIG. 22, a redistribution structure 114 is formed on the conductive vias 112, the dielectric layer 108, and the combination memory devices 510. The redistribution structure 114 is similar to that discussed with respect to FIG. 8, and can be formed in a similar manner. The metallization patterns of the redistribution structure 114 are connected to the conductive vias 112 and the back sides 510B of the combination memory devices 510 (e.g., to the conductive vias 520). The metallization patterns of the redistribution structure 114 include power supply source ($V_{DD}$) lines and power supply ground ($V_{SS}$) lines, which are electrically coupled to the processor device 10 and passive devices 40 by the conductive vias 112 to form power delivery networks for the semiconductor devices in the integrated circuit package 500.

In FIG. 23, a singulation process is performed by sawing along scribe line regions, e.g., around the device region 102A. The singulation process is similar to that discussed with respect to FIG. 9. After singulation, the processor device 10, the dielectric layers 104, 108, and the redistribution structure 114 are laterally coterminous.

FIG. 24 illustrates the electrical connections among the semiconductor devices of the resulting integrated circuit package 500. Some features are omitted from FIG. 24 for clarity of illustration. A pair of first memory devices 20 (e.g., an instruction cache device 20I and a data cache device 20D) are connected to each of the processing units 10A, 10B, 10C, 10D by direct bonds 530. Combination memory devices 510 are connected to the first memory devices 20 by direct bonds 532. Passive devices 40 are optionally connected to the processing units 10A, 10B, 10C, 10D by direct bonds 534. The redistribution structure 114 is electrically coupled to the processor device 10 by the conductive vias 112A, and is electrically coupled to the passive devices 40 by the conductive vias 112B.

Figure 25:
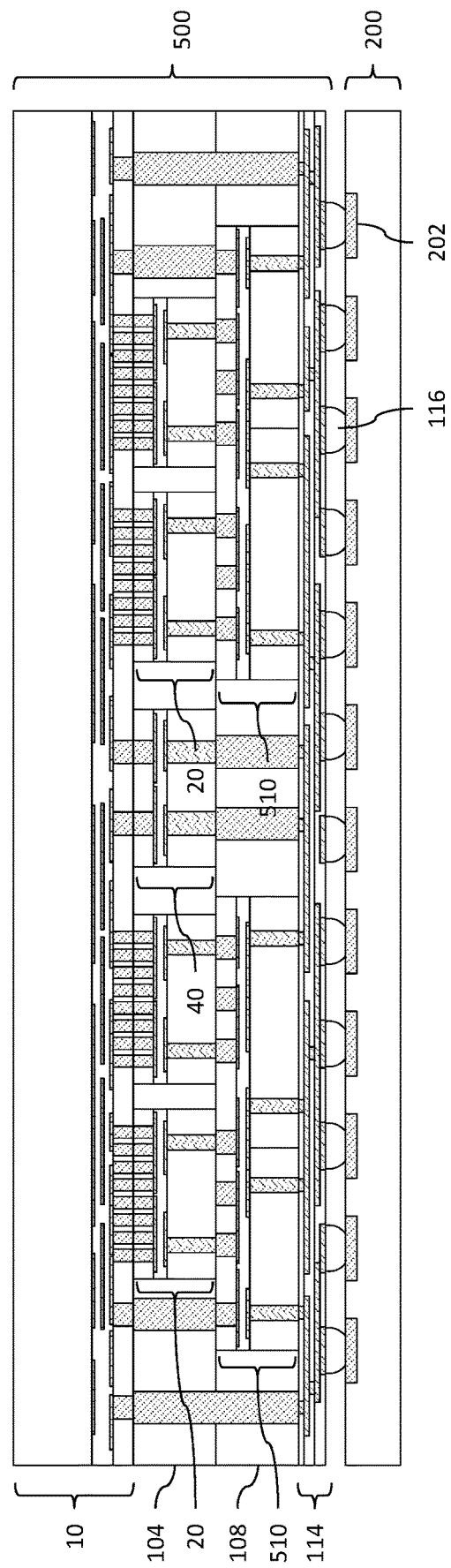
FIG. 25 is a cross-sectional view of a system implementing an integrated circuit package, in accordance with some other embodiments.
Figure 26:
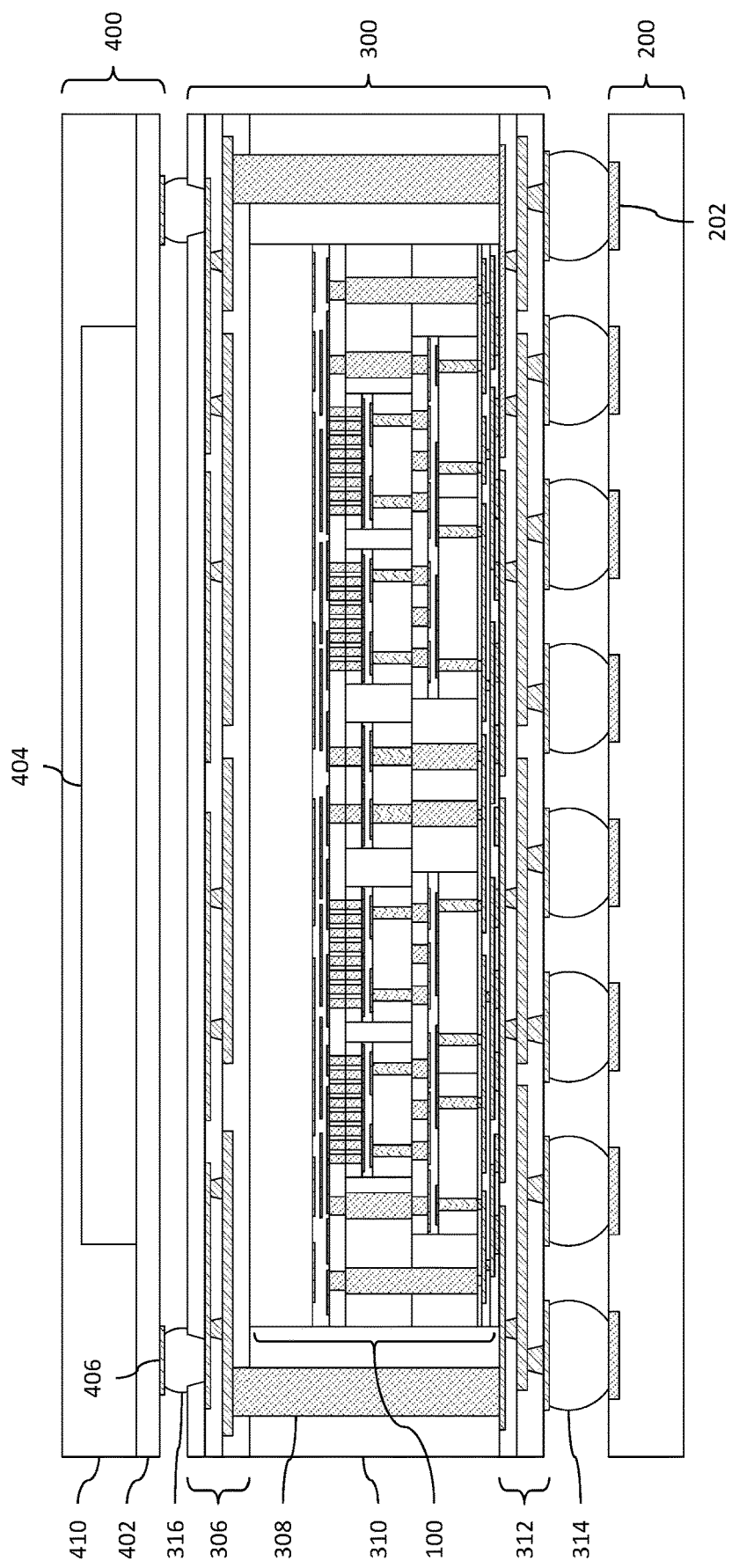
FIG. 26 is a cross-sectional view of a system implementing an integrated circuit package, in accordance with some other embodiments.

After the integrated circuit package 500 is formed, it can be implemented in systems similar to those discussed with respect to FIGS. 12 and 17. In some embodiments, the integrated circuit package 500 is directly mounted to a package substrate 200 (see FIG. 25). In some embodiments, the integrated circuit package 500 is singulated and included in a package component, which is mounted to a package substrate 200 (see FIG. 26).

Figure 29:
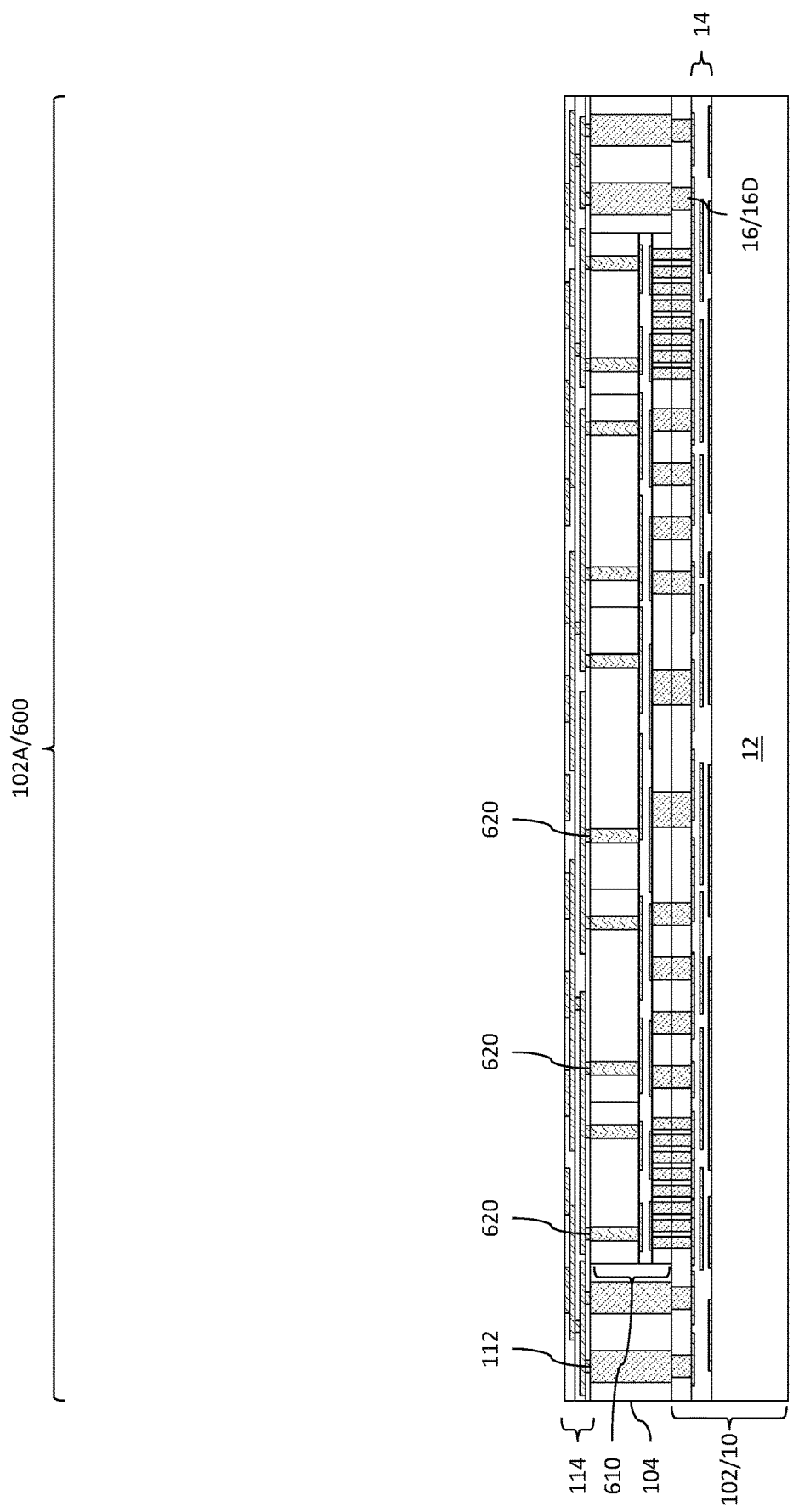
Figure 30:
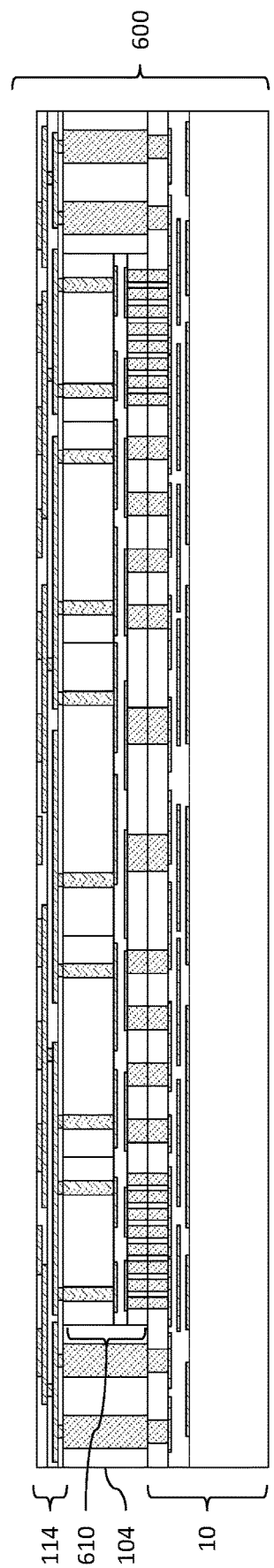
Figure 31:
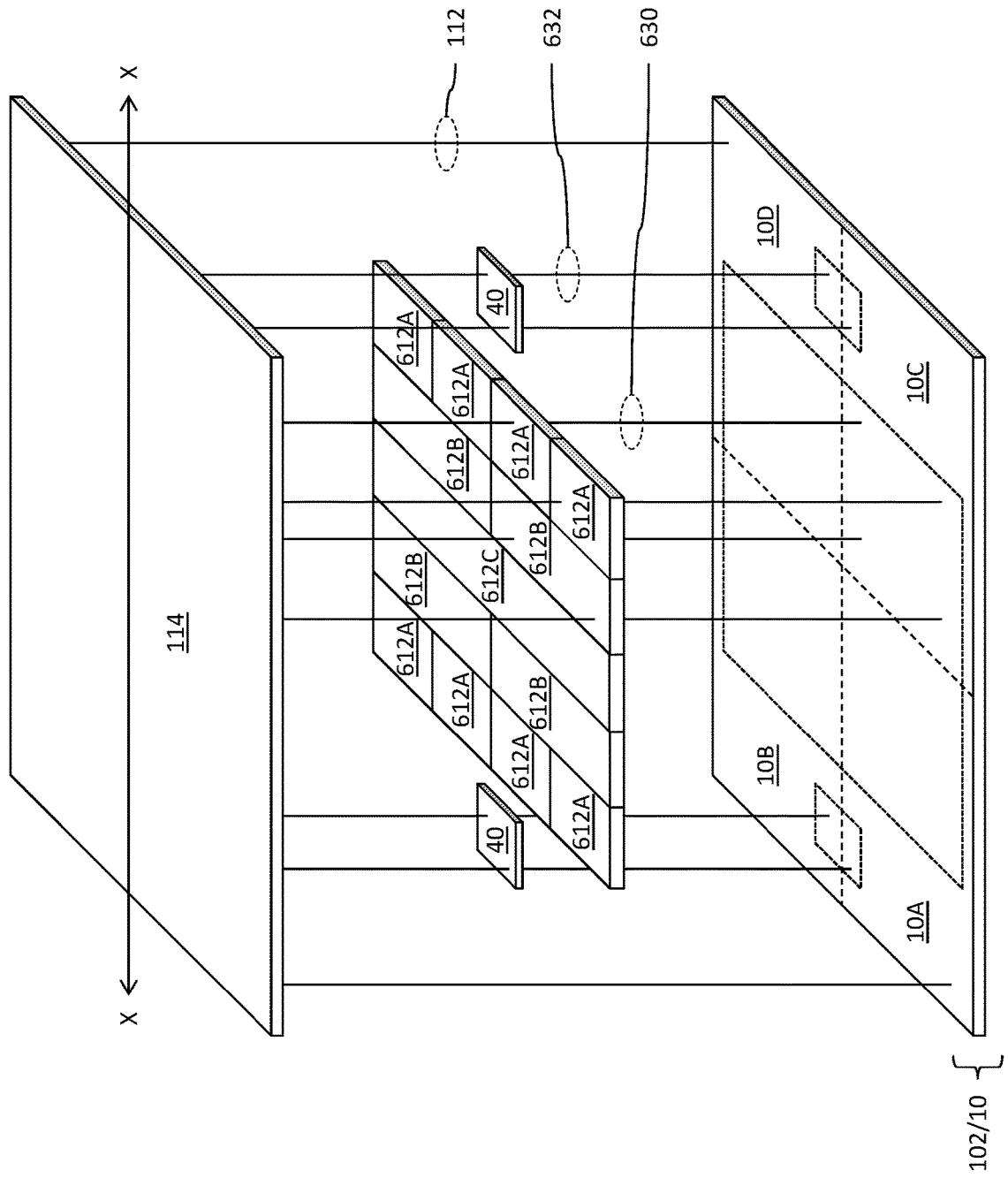

FIGS. 27 through 31 are various views of intermediate steps during a process for forming an integrated circuit package 600, in accordance with some other embodiments. FIGS. 27 through 30 are cross-sectional views of the integrated circuit package 600, and FIG. 31 is a three-dimensional diagram illustrating electrical connections among the semiconductor devices of the integrated circuit package 600, where the cross-sectional views are illustrated along reference cross-section X-X in FIG. 31. Some features are omitted from FIG. 31 for clarity of illustration. In this embodiment, some of the memory devices are combined so that a single memory device can be used to provide L1, L2, and L3 caches for a processing unit. The quantity of device layers in the integrated circuit package 600 may thus be further reduced.

Figure 27:
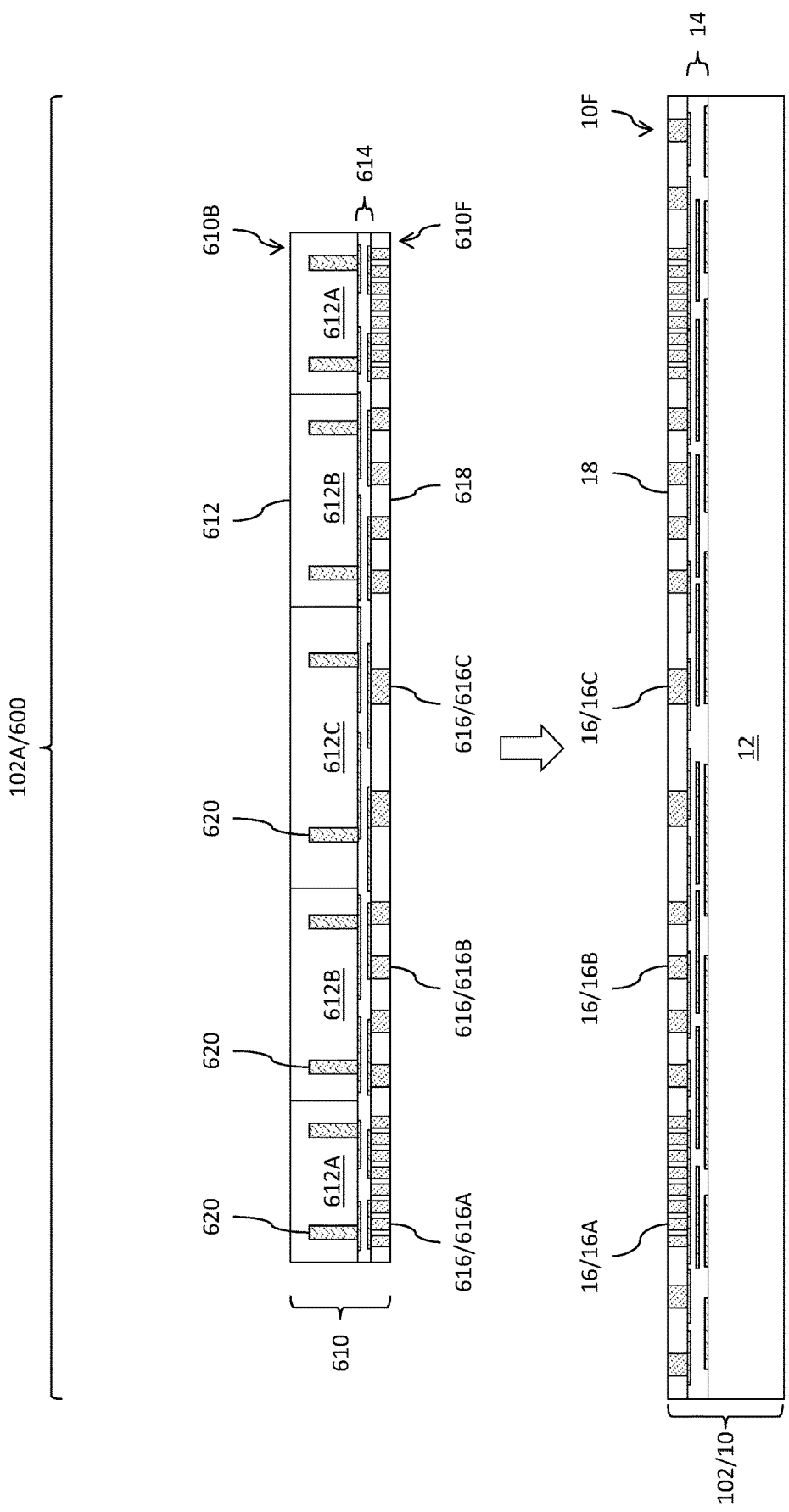
FIGS. 27 through 31 are various views of intermediate steps during a process for forming an integrated circuit package, in accordance with some other embodiments.

In FIG. 27, a wafer 102 is obtained. The wafer 102 is similar to that discussed with respect to FIG. 1, and comprises a processor device 10 in the device region 102A. A combination memory device 610 is then bonded to the processor device 10 (e.g., the wafer 102). The combination memory device 610 provides multiple types of memories for the processor device 10. For example, the combination memory device 610 can be L1, L2, and L3 caches for the processor device 10.

The combination memory device 610 may be processed according to applicable manufacturing processes to form integrated circuits. For example, the combination memory device 610 includes a semiconductor substrate 612. The semiconductor substrate 612 can be similar to the semiconductor substrate 12 (see FIG. 2), but includes three memory regions 612A, 612B, 612C. The memory regions 612A, 612B, 612C include different types of memory, such as L1, L2, and L3 caches, respectively. The combination memory device 610 further includes an interconnect structure 614, die connectors 616, a dielectric layer 618, and conductive vias 620 which, respectively, can be similar to the interconnect structure 14, die connectors 16, dielectric layer 18, and conductive vias 30 (see FIG. 2). The die connectors 616 and dielectric layer 618 are exposed at a front side 610F of the combination memory device 610. In the embodiment illustrated, the conductive vias 620 are not yet exposed at a back side 610B of the combination memory device 610, but will be exposed in subsequent processing to form TSVs.

Referring to FIG. 31, the combination memory device 610 is shared by all of the processing units 10A, 10B, 10C, 10D of the processor device 10 The combination memory device 610 includes two memory region 612A (such as an instruction cache region (e.g., a L1i cache) and a data cache region (e.g., a L1d cache)) and one memory region 612B (such as a L2 cache) for each processing unit it is bonded to. The combination memory device 610 further includes one memory region 612C (such as an L3 cache) that is shared by all processing units. In the embodiment shown, the combination memory device 610 is bonded to four processing units, and thus includes eight memory regions 612A, four memory regions 612B, and one memory region 612C. The memory regions 612A, 612B, 612C of the combination memory device 610 are electrically coupled by the interconnect structure 614. The combination memory device 610 is connected to the processor device 10 by direct bonds, over which control signaling and data signaling is performed.

The processor device 10 and combination memory device 610 are directly bonded in a face-to-face manner by hybrid bonding, such that the front side 10F of the processor device 10 is bonded to the front side 610F of the combination memory device 610. Specifically, the dielectric layer 18 of the processor device 10 is bonded to the dielectric layer 628 of the combination memory device 610 through dielectric-to-dielectric bonding, without using any adhesive material (e.g., die attach film), and the die connectors 16 of the processor device 10 are bonded to the die connectors 626 of the combination memory device 610 through metal-to-metal bonding, without using any eutectic material (e.g., solder).

The combination memory device 610 have active devices of a minimum feature size in the range of about 2 nm to about 65 nm. As noted above, the combination memory device 610 has multiple types of memories. As such, the die connectors 616 of the combination memory device 610 can be grouped into several subsets that have different pitches. For example, a first subset of the die connectors 616A can have a pitch in the range of about 0.05 µm to about 10 µm, and can be electrically coupled to the memory regions 612A of the combination memory device 610. Likewise, a second subset of the die connectors 616B can have a pitch in the range of about 0.3 µm to about 90 µm, and can be electrically coupled to the memory regions 612B of the combination memory device 610. Further, a third subset of the die connectors 616C can have a pitch in the range of about 0.5 µm to about 90 µm, and can be electrically coupled to the memory region 612C of the combination memory device 610. The pitch of the die connectors 616C is greater than the pitch of the die connectors 616B, and the pitch of the die connectors 616B is greater than the pitch of the die connectors 616A. The die connectors 16 of processor device 10 have the same pitch as the corresponding die connectors 616 of the combination memory device 610. Specifically, a first subset of the die connectors 16A have the same pitch as the die connectors 616A, a second subset of the die connectors 16B have the same pitch as the die connectors 616B, and a third subset of the die connectors 16C have the same pitch as the die connectors 616C. Forming the die connectors 16 and 616 with varying pitches allows a single memory device to accommodate multiple types of memory, thus reducing the amount of dies included in the integrated circuit package 600 and allowing the integrated circuit package 600 to be formed at a low cost.

Optionally, passive devices 40 (see FIG. 31) are also bonded to the processor device 10 (e.g., the wafer 102). The passive devices 40 are similar to those discussed with respect to FIG. 2, and can be part of the power delivery network for the processor device 10. Referring to FIG. 31, the passive devices 40 can be shared by some or all of the processing units 10A, 10B, 10C, 10D of the processor device 10. The processor device 10 and passive devices 40 are directly bonded in a face-to-face manner by hybrid bonding, in a similar manner as that discussed above with respect to FIG. 2.

Figure 28:
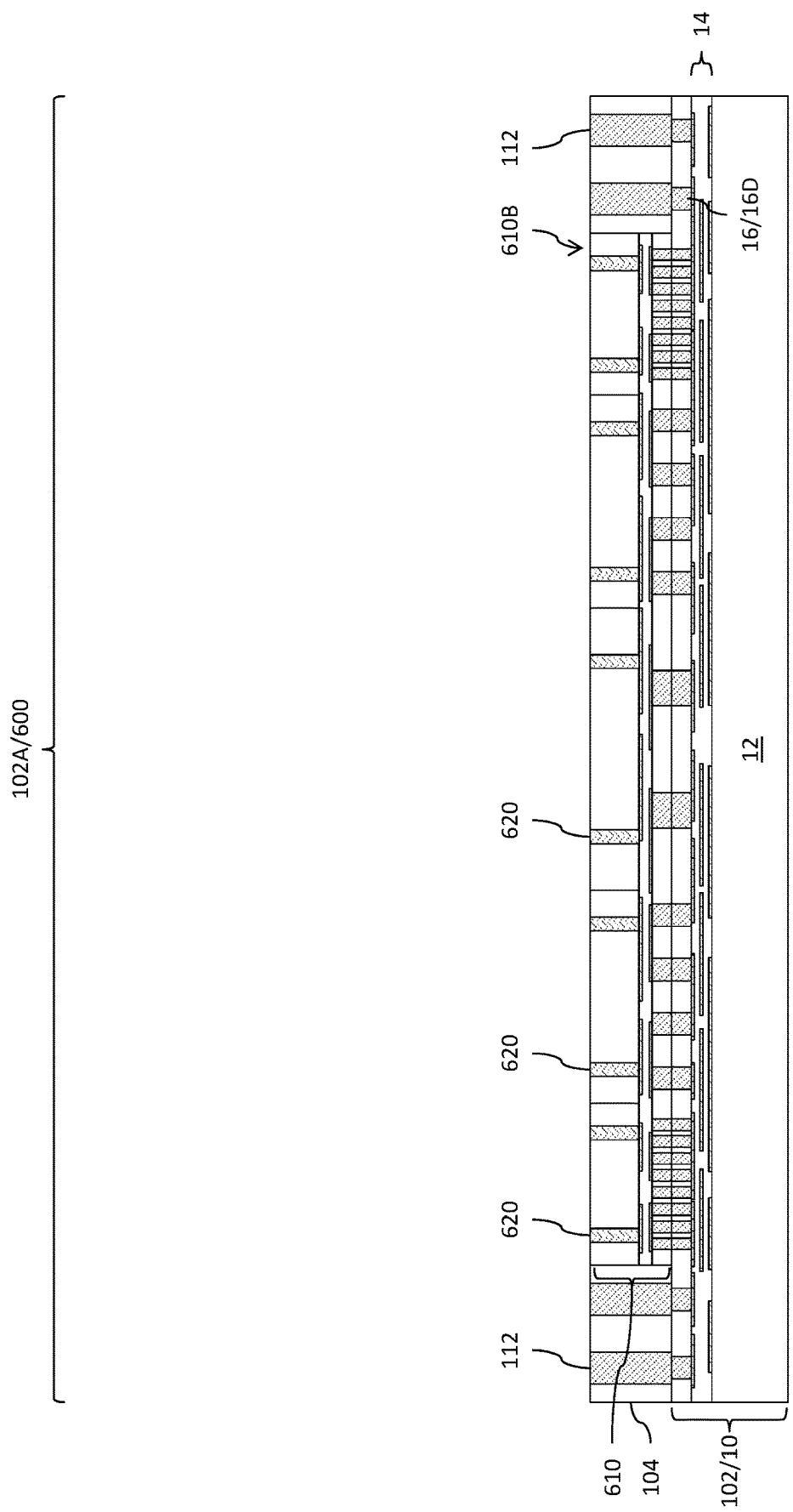

In FIG. 28, a dielectric layer 104 is formed surrounding the combination memory device 610 and passive devices 40 (see FIG. 31). The dielectric layer 104 is similar to that discussed with respect to FIG. 3, and can be formed in a similar manner. Conductive vias 112 are then formed to extend through the dielectric layer 104. The conductive vias 112 are similar to those discussed with respect to FIG. 7, and can be formed in a similar manner. The conductive vias 112 are connected to a subset of the die connectors 16D of the processor device 10. A planarization process is performed to expose the conductive vias 620.

In FIG. 29, a redistribution structure 114 is formed on the conductive vias 112, the dielectric layer 104, and the combination memory device 610. The redistribution structure 114 is similar to that discussed with respect to FIG. 8, and can be formed in a similar manner. The metallization patterns of the redistribution structure 114 are connected to the conductive vias 112 and the back sides 610B of the combination memory device 610 (e.g., to the conductive vias 620). The metallization patterns of the redistribution structure 114 include power supply source ($V_{DD}$) lines and power supply ground ($V_{SS}$) lines, which are electrically coupled to the processor device 10 and passive devices 40 to form power delivery networks for the semiconductor devices in the integrated circuit package 600. The metallization patterns of the redistribution structure 114 are electrically coupled to the processor device 10 by the conductive vias 112, and are electrically coupled to the passive devices 40 by the conductive vias 50. Conductive connectors 116 are then formed electrically coupled to the metallization patterns of the redistribution structure 114. The conductive connectors 116 are similar to those discussed with respect to FIG. 8, and can be formed in a similar manner.

In FIG. 30, a singulation process is performed by sawing along scribe line regions, e.g., around the device region 102A. The singulation process is similar to that discussed with respect to FIG. 9. After singulation, the processor device 10, the dielectric layer 104, and the redistribution structure 114 are laterally coterminous.

FIG. 31 illustrates the electrical connections among the semiconductor devices of the resulting integrated circuit package 600. Some features are omitted from FIG. 31 for clarity of illustration. The combination memory device 610 is connected to the processing units 10A, 10B, 10C, 10D by direct bonds 630. Passive devices 40 are optionally connected to the processing units 10A, 10B, 10C, 10D by direct bonds 632. The redistribution structure 114 is electrically coupled to the processor device 10 by the conductive vias 112.

Figure 32:
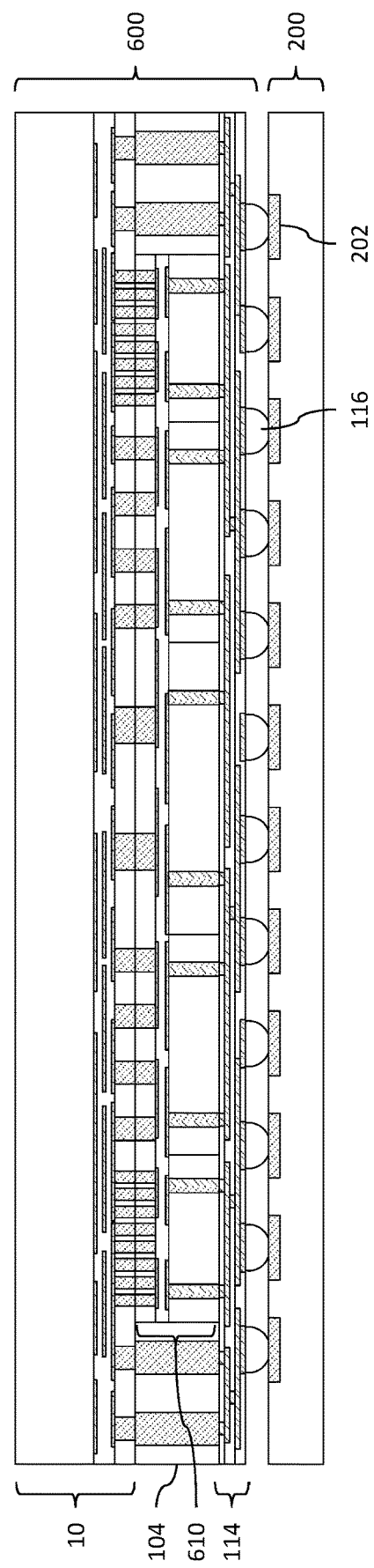
FIG. 32 is a cross-sectional view of a system implementing an integrated circuit package, in accordance with some other embodiments.
Figure 33:
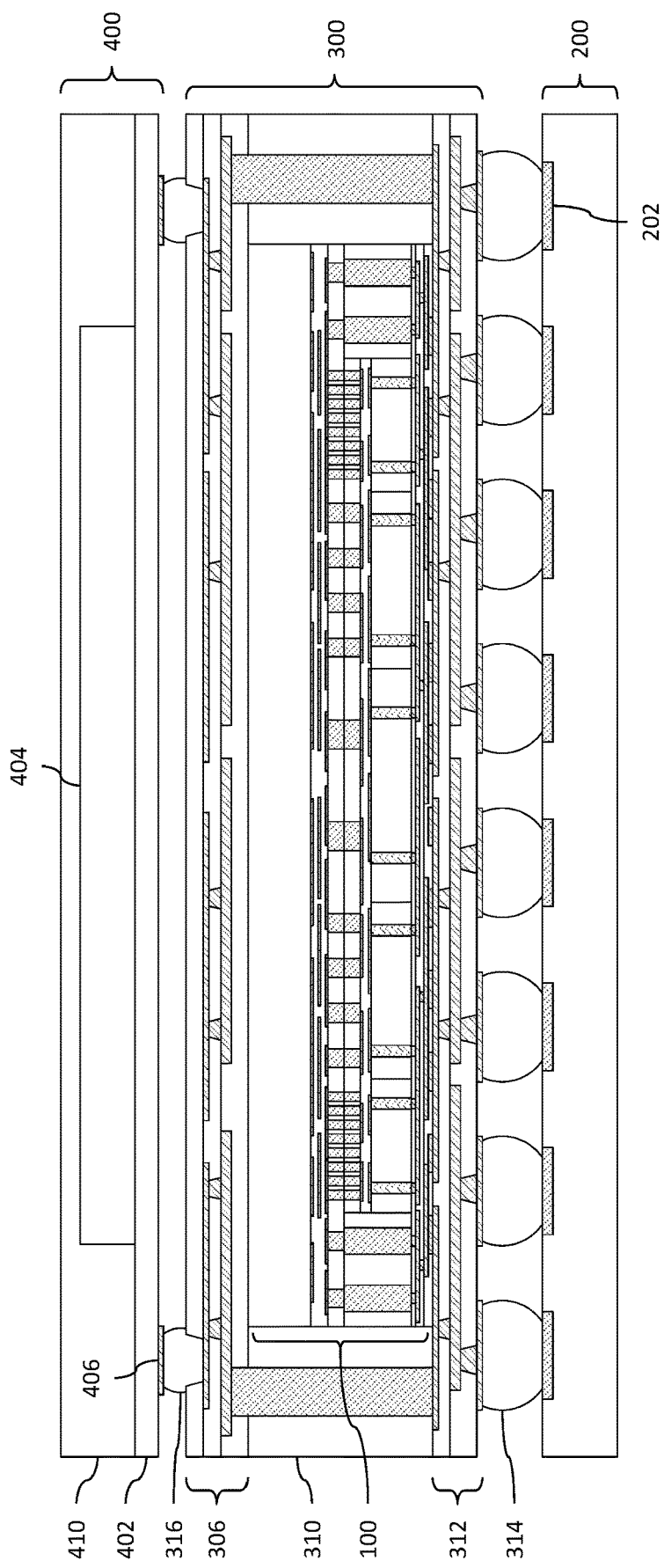
FIG. 33 is a cross-sectional view of a system implementing an integrated circuit package, in accordance with some other embodiments.

After the integrated circuit package 600 is formed, it can be implemented in systems similar to those discussed with respect to FIGS. 12 and 17. In some embodiments, the integrated circuit package 600 is directly mounted to a package substrate 200 (see FIG. 32). In some embodiments, the integrated circuit package 600 is singulated and included in a package component, which is mounted to a package substrate 200 (see FIG. 33).

Embodiments may achieve advantages. Stacking memory devices on a processor device instead of including memories with the processor device may allow the overall amount of memory in an integrated circuit package to be increased without substantially increasing manufacturing costs of the processor device. Further, forming a processor device without memories allows more processing units (e.g., cores) to be included in the processor device without substantially increasing the footprint of the processor device. Connecting the processor device and memory devices by hybrid bonding allows the connections between the devices to be shorter than traditional interconnects. The latency of data signaling and the interconnection bandwidth between the processor device and memory devices may thus be improved. Further, the impedance and thus power consumption of the connections may also be reduced.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an embodiment, a structure includes: a processor device including logic devices and being free from memories; a first memory device directly face-to-face bonded to the processor device by metal-to-metal bonds and by dielectric-to-dielectric bonds; a first dielectric layer laterally surrounding the first memory device; a redistribution structure over the first dielectric layer and the first memory device, the redistribution structure including metallization patterns; and first conductive vias extending through the first dielectric layer, the first conductive vias connecting the metallization patterns of the redistribution structure to the processor device.

In some embodiments of the structure, the metallization patterns of the redistribution structure are connected to the first memory device. In some embodiments, the structure further includes: a passive device directly face-to-face bonded to the processor device by metal-to-metal bonds and by dielectric-to-dielectric bonds, the first dielectric layer laterally surrounding the passive device, the metallization patterns of the redistribution structure connected to the passive device. In some embodiments, the structure further includes: a second memory device directly face-to-back bonded to the first memory device by metal-to-metal bonds and by dielectric-to-dielectric bonds, the metallization patterns of the redistribution structure connected to the second memory device; second conductive vias extending through the first dielectric layer, the second conductive vias connecting the second memory device to the processor device; and a second dielectric layer laterally surrounding the second memory device, the first conductive vias extending through the second dielectric layer. In some embodiments, the structure further includes: a passive device directly face-to-face bonded to the processor device by metal-to-metal bonds and by dielectric-to-dielectric bonds, the first dielectric layer laterally surrounding the passive device; and third conductive vias extending through the second dielectric layer, the third conductive vias connecting the redistribution structure to the passive device. In some embodiments, the structure further includes: a second memory device directly face-to-back bonded to the first memory device by metal-to-metal bonds and by dielectric-to-dielectric bonds; second conductive vias extending through the first dielectric layer, the second conductive vias connecting the second memory device to the processor device; a second dielectric layer laterally surrounding the second memory device, the first conductive vias extending through the second dielectric layer; a third memory device directly face-to-back bonded to the second memory device by metal-to-metal bonds and by dielectric-to-dielectric bonds, the redistribution structure connected to the third memory device; and a third dielectric layer laterally surrounding the third memory device, the first conductive vias extending through the third dielectric layer. In some embodiments, the structure further includes: a passive device directly face-to-face bonded to the processor device by metal-to-metal bonds and by dielectric-to-dielectric bonds, the first dielectric layer laterally surrounding the passive device; and third conductive vias extending through the second dielectric layer and the third dielectric layer, the third conductive vias connecting the redistribution structure to the passive device. In some embodiments, the structure further includes: a package substrate; and conductive connectors connecting the package substrate to the redistribution structure.

In an embodiment, a structure includes: a processor device having a front side; a first memory device having a front side and a back side opposite the front side, the front side of the first memory device connected to the front side of the processor device by metal-to-metal bonds and by dielectric-to-dielectric bonds; a first dielectric layer laterally surrounding the first memory device; first conductive vias extending through the first dielectric layer, the first conductive vias connected to the front side of the processor device; a second memory device having a front side and a back side opposite the front side, the front side of the second memory device connected to the first conductive vias and the back side of the first memory device by metal-to-metal bonds, the front side of the second memory device connected to the first dielectric layer and the back side of the first memory device by dielectric-to-dielectric bonds, the first memory device being a different type of memory device than the second memory device; and a second dielectric layer laterally surrounding the second memory device.

In some embodiments, the structure further includes: a third memory device having a front side and a back side opposite the front side, the front side of the third memory device connected to the second dielectric layer and the back side of the second memory device by dielectric-to-dielectric bonds, the front side of the third memory device connected to the back side of the second memory device by metal-to-metal bonds; a third dielectric layer laterally surrounding the third memory device; second conductive vias extending through the first dielectric layer, the second dielectric layer, and the third dielectric layer, the second conductive vias connected to the front side of the processor device; and a redistribution structure connected to the second conductive vias and the back side of the third memory device. In some embodiments of the structure, the first memory device is a level 1 (L1) cache for the processor device, the second memory device is a level 2 (L2) cache for the processor device, and the third memory device is a level 3 (L3) cache for the processor device. In some embodiments, the structure further includes: second conductive vias extending through the first dielectric layer and the second dielectric layer, the second conductive vias connected to the front side of the processor device; and a redistribution structure connected to the second conductive vias and the back side of the second memory device. In some embodiments of the structure, the first memory device is a level 1 (L1) cache for the processor device, and the second memory device is both a level 2 (L2) cache and a level 3 (L3) cache for the processor device. In some embodiments of the structure, the processor device includes a plurality of processing units, and the structure further includes: first memory devices, the first memory device being one of the first memory devices, respective pairs of the first memory devices being connected to respective ones of the processing units of the processor device; and second memory devices, the second memory device being one of the second memory devices, respective ones of the second memory devices being connected to one of the pairs of the first memory devices. In some embodiments of the structure, the first memory device includes active devices of a first minimum feature size, and the second memory device includes active devices of a second minimum feature size, the second minimum feature size being larger than the first minimum feature size. In some embodiments of the structure, the first memory device includes first die connectors connected to the front side of the processor device, and the second memory device includes second die connectors connected to the first conductive vias and the back side of the first memory device, the first die connectors having a first pitch, the second die connectors having a second pitch, the second pitch being larger than the first pitch. In some embodiments of the structure, the processor device, the first dielectric layer, and the second dielectric layer are laterally coterminous.

In an embodiment, a method includes: bonding a first memory device to a wafer, the wafer including a processor device, the first memory device including first conductive vias; forming a first dielectric layer around the first memory device; patterning first openings in the first dielectric layer, the first openings exposing die connectors of the processor device; plating a conductive material in the first openings and on the die connectors; planarizing the conductive material to form second conductive vias in the first openings, the planarizing exposing the first conductive vias of the first memory device; and sawing the first dielectric layer and the wafer to singulate the processor device.

In some embodiments, the method further includes: before the sawing, bonding a second memory device to the first dielectric layer, the first conductive vias, and the second conductive vias. In some embodiments, the method further includes: before the sawing, forming a redistribution structure on the first dielectric layer, the first conductive vias, and the second conductive vias, the sawing including sawing the redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a processor device;
   a first memory device directly face-to-face bonded to the processor device by metal-to-metal bonds and by dielectric-to-dielectric bonds, the first memory device comprising a first conductive via;
   a first dielectric layer laterally surrounding the first memory device, a sidewall of the first dielectric layer being laterally coterminous with a sidewall of the processor device; and
   a second conductive via extending through the first dielectric layer, the second conductive via connected to the processor device, a top surface of the second conductive via being planar with a top surface of the first dielectric layer and a top surface of the first conductive via.

2. The device of claim 1, further comprising:
   a redistribution structure on the top surface of the first dielectric layer, the top surface of the second conductive via, and the top surface of the first conductive via.

3. The device of claim 1, further comprising:
   a second memory device on the top surface of the first dielectric layer, the top surface of the second conductive via, and the top surface of the first conductive via; and
   a second dielectric layer laterally surrounding the second memory device.

4. The device of claim 1, further comprising:
   a passive device directly bonded to the processor device by metal-to-metal bonds and by dielectric-to-dielectric bonds, the first dielectric layer laterally surrounding the passive device.

5. The device of claim 4, wherein the passive device comprises a third conductive via, a top surface of the third conductive via being planar with the top surface of the second conductive via, the top surface of the first dielectric layer, and the top surface of the first conductive via.

6. The device of claim 1, further comprising:
   a redistribution structure over the first dielectric layer and the first memory device, a sidewall of the redistribution structure being laterally coterminous with the sidewall of the processor device and with the sidewall of the first dielectric layer; and
   a package substrate connected to the redistribution structure.

7. The device of claim 1, further comprising:
   a first redistribution structure over the first dielectric layer and the first memory device, a sidewall of the first redistribution structure being laterally coterminous with the sidewall of the processor device and with the sidewall of the first dielectric layer;
   an encapsulant laterally surrounding the first redistribution structure, the first dielectric layer, and the processor device;
   a second redistribution structure over the encapsulant; and
   a package substrate connected to the second redistribution structure.

8. The device of claim 1, wherein the processor device is free of memories.

9. A device comprising:
a processor device having a front side;
a first memory device having a front side and a back side opposite the front side, the front side of the first memory device bonded to the front side of the processor device by metal-to-metal bonds and by dielectric-to-dielectric bonds;
a first dielectric layer laterally surrounding the first memory device;
first conductive vias extending through the first dielectric layer, the first conductive vias connected to the front side of the processor device;
a second memory device having a front side and a back side opposite the front side, the front side of the second memory device bonded to the first conductive vias and the back side of the first memory device by metal-to-metal bonds, the front side of the second memory device bonded to the first dielectric layer and the back side of the first memory device by dielectric-to-dielectric bonds, the first memory device being a different type of memory device than the second memory device; and
a second dielectric layer laterally surrounding the second memory device, a sidewall of the second dielectric layer being laterally coterminous with a sidewall of the first dielectric layer and with a sidewall of the processor device.

10. The device of claim 9, further comprising:
a third memory device having a front side and a back side opposite the front side, the front side of the third memory device bonded to the second dielectric layer and the back side of the second memory device by dielectric-to-dielectric bonds, the front side of the third memory device bonded to the back side of the second memory device by metal-to-metal bonds;
a third dielectric layer laterally surrounding the third memory device, a sidewall of the third dielectric layer being laterally coterminous with the sidewall of the second dielectric layer, with the sidewall of the first dielectric layer, and with the sidewall of the processor device; and
second conductive vias extending through the first dielectric layer, the second dielectric layer, and the third dielectric layer, the second conductive vias connected to the front side of the processor device.

11. The device of claim 10, wherein the processor device is free from memories, the first memory device is a level 1 cache for the processor device, the second memory device is a level 2 cache for the processor device, and the third memory device is a level 3 cache for the processor device.

12. The device of claim 9, further comprising:
second conductive vias extending through the first dielectric layer and the second dielectric layer, the second conductive vias connected to the front side of the processor device.

13. The device of claim 12, wherein the processor device is free from memories, the first memory device is a level 1 cache for the processor device, and the second memory device is both a level 2 cache and a level 3 cache for the processor device.

14. The device of claim 9, wherein the first memory device is an instruction cache device, and the device further comprises:
a data cache device having a front side and a back side opposite the front side, the front side of the data cache device bonded to the front side of the processor device by metal-to-metal bonds and by dielectric-to-dielectric bonds, the first dielectric layer laterally surrounding the data cache device.

15. The device of claim 14, wherein the processor device comprises a plurality of processing units, and the instruction cache device and the data cache device are disposed directly over a same processing unit of the processing units.

16. The device of claim 9, wherein the first memory device comprises active devices of a first minimum feature size, and the second memory device comprises active devices of a second minimum feature size, the second minimum feature size being different than the first minimum feature size.

17. The device of claim 9, wherein the first memory device comprises first die connectors connected to the front side of the processor device, and the second memory device comprises second die connectors connected to the first conductive vias and the back side of the first memory device, the first die connectors having a first pitch, the second die connectors having a second pitch, the second pitch being different than the first pitch.

18. A method comprising:
bonding a first memory device to a wafer, the wafer comprising a processor device, the first memory device comprising a first conductive via;
forming a first dielectric layer around the first memory device;
forming a second conductive via through the first dielectric layer, the second conductive via connected to the processor device, a top surface of the second conductive via being planar with a top surface of the first dielectric layer and a top surface of the first conductive via; and
sawing the first dielectric layer and the wafer to singulate the processor device, a sidewall of the first dielectric layer being laterally coterminous with a sidewall of the processor device.

19. The method of claim 18, further comprising:
forming the processor device in the wafer without memories.

20. The method of claim 18, wherein the processor device comprises a plurality of processing units, and the first memory device is disposed directly over one of the processing units.

* * * * *